(12) United States Patent
Sunada et al.

(10) Patent No.: US 10,360,991 B2
(45) Date of Patent: Jul. 23, 2019

(54) SEMICONDUCTOR DEVICE, MONITORING SYSTEM, AND LIFETIME PREDICTION METHOD

(71) Applicant: Renesas Electronics Corporation, Tokyo (JP)

(72) Inventors: Takeshi Sunada, Tokyo (JP); Daisuke Oshida, Tokyo (JP); Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 188 days.

(21) Appl. No.: 15/418,389

(22) Filed: Jan. 27, 2017

(65) Prior Publication Data

US 2017/0277455 A1   Sep. 28, 2017

(30) Foreign Application Priority Data

Mar. 25, 2016   (JP) .................................. 2016-062041

(51) Int. Cl.

| | |
|---|---|
| *G06F 11/00* | (2006.01) |
| *G06F 11/22* | (2006.01) |
| *G06F 11/30* | (2006.01) |
| *G11C 16/34* | (2006.01) |
| *G11C 17/18* | (2006.01) |
| *G11C 29/04* | (2006.01) |
| *G11C 29/12* | (2006.01) |
| *G11C 29/42* | (2006.01) |

(Continued)

(52) U.S. Cl.
CPC ............ *G11C 29/44* (2013.01); *G06F 11/008* (2013.01); *G06F 11/2284* (2013.01); *G06F 11/3072* (2013.01); *G11C 29/12005* (2013.01); *G11C 29/42* (2013.01); *G11C 29/52* (2013.01); *G06F 2201/81* (2013.01); *G11C 16/349* (2013.01); *G11C 17/18* (2013.01); *G11C 29/50004* (2013.01); *G11C 2029/0409* (2013.01)

(58) Field of Classification Search
CPC .... G06F 3/0616; G06F 3/0679; G06F 3/0629; G06F 11/008; G06F 11/3058
See application file for complete search history.

(56) References Cited

U.S. PATENT DOCUMENTS

| | | | |
|---|---|---|---|
| 7,890,233 B2 | 2/2011 | Yamada et al. | |
| 2009/0288092 A1* | 11/2009 | Yamaoka | G06F 9/5033 |
| | | | 718/104 |

(Continued)

FOREIGN PATENT DOCUMENTS

JP   2009-237849 A   10/2009

*Primary Examiner* — Jigar P Patel
(74) *Attorney, Agent, or Firm* — McGinn IP Law Group, PLLC.

(57) ABSTRACT

The disclosed invention can provide a semiconductor device, a lifetime prediction system, and a lifetime prediction method enabling it to notify a user that a semiconductor device is likely to become faulty, before the semiconductor device becomes faulty. A semiconductor device includes functional units and a lifetime prediction circuit. The lifetime prediction circuit acquires a deterioration degree indicating a degree of how each functional unit deteriorates, using a signal that is output from each functional unit. The lifetime prediction circuit executes processing to make a notification that the semiconductor device is close to its lifetime, if the deterioration degree is more than a first threshold.

18 Claims, 18 Drawing Sheets

(51) Int. Cl.
*G11C 29/44* (2006.01)
*G11C 29/50* (2006.01)
*G11C 29/52* (2006.01)

(56) References Cited

U.S. PATENT DOCUMENTS

| | | | |
|---|---|---|---|
| 2015/0233849 A1* | 8/2015 | Fukui | G01K 15/007 374/4 |
| 2016/0070321 A1* | 3/2016 | Shapira | G06F 1/26 713/300 |
| 2016/0091573 A1* | 3/2016 | Shiraishi | G01R 31/3679 324/430 |
| 2016/0116924 A1* | 4/2016 | Meijer | G05F 1/462 327/143 |

* cited by examiner

SEMICONDUCTOR DEVICE, MONITORING SYSTEM, AND LIFETIME PREDICTION METHOD

CROSS-REFERENCE TO RELATED APPLICATIONS

The disclosure of Japanese Patent Application No. 2016-062041 filed on Mar. 25, 2016 including the specification, drawings and abstract is incorporated herein by reference in its entirety.

BACKGROUND

The present invention relates to a semiconductor device, a monitoring system, and a lifetime prediction method.

Recently, ISO 26262 has received attention as Functional Safety standards for in-vehicle electronic equipment or the like. Functional Safety means that, even in case a fault has occurred in a microcomputer (e.g., MCU: Micro Control Unit) which is a component of an in-vehicle equipment, a minimum allowable safety level is assured by taking functional measures. For instance, it is required to detect a fault, if having occurred, and perform a control action to make the transition to another operation (for example, stopping a vehicle safely).

One example of functional means is a lock-step scheme using a plurality of processor cores. In association with this technique, Patent Document 1 describes a microcontroller equipped with two data processing units having the same functionality. The microcomputer pertaining to Patent Document 1 includes a first data processing unit, a second data processing unit that performs the same data processing as the first data processing unit does, and a comparator. The comparator compares an output from the first data processing unit and an output from the second data processing unit. In the event of a compared result mismatch, it is decided that a fault having occurred in the first data processing unit has been detected, exception handling, e.g., stopping the microcomputer is performed.

RELATED ART DOCUMENT

Patent Document

[Patent Document 1]
Japanese Unexamined Patent Application Publication No. 2009-237849

SUMMARY

By a technique pertaining to Patent Document 1, it is possible to assure an allowable safety level even in case a fault has occurred in a semiconductor device. On the other hand, even if a Functional Safety technique has been adopted, there is a risk of trouble occurring in case a semiconductor fault has been occurred. For instance, if a control action for stopping a vehicle is performed upon the occurrence of a semiconductor fault, there is a risk of some trouble occurring because of, e.g., sudden stopping of the vehicle.

Other problems and novel features will become apparent from description in the present specification and attached drawings.

According to one embodiment, a semiconductor device includes one or more functional units and a lifetime prediction circuit that acquires a deterioration degree indicating a degree of how each of the functional units deteriorates, using a signal that is output from each of the functional units, and, if the deterioration degree is more than a first threshold which has been predetermined, executes processing to make a notification that the semiconductor device is close to its lifetime.

According to one embodiment, a lifetime prediction system includes one or more semiconductor devices and a monitoring device that monitors the semiconductor devices. Each of the semiconductor devices includes one or more functional units and a lifetime prediction circuit that acquires a deterioration degree indicating a degree of how each of the functional units deteriorates or a parameter that is used for acquiring the deterioration degree, using a signal that is output from each of the functional units. The monitoring device executes processing to make a notification that any of the semiconductor devices is close to its lifetime, if the deterioration degree is more than a first threshold which has been predetermined.

According to one embodiment, a lifetime prediction method includes acquiring a deterioration degree indicating a degree of how each functional unit deteriorates, using a signal that is output from one or more functional units included in a semiconductor device; determining whether or not the deterioration degree is below or at a first threshold which has been predetermined; and executing processing to make a notification that the semiconductor device is close to its lifetime, if the deterioration degree is more than the first threshold.

A method or system represented to replace the device of the foregoing embodiment, a program that causes a computer to perform processing on the device or a part of the device, and an imaging device equipped with that device, among others, are also available as embodiments of the invention.

According to one of the foregoing embodiments, it is possible to notify a user that a semiconductor device is likely to become faulty, before the semiconductor device becomes faulty.

DETAILED DESCRIPTION

Figure 1:
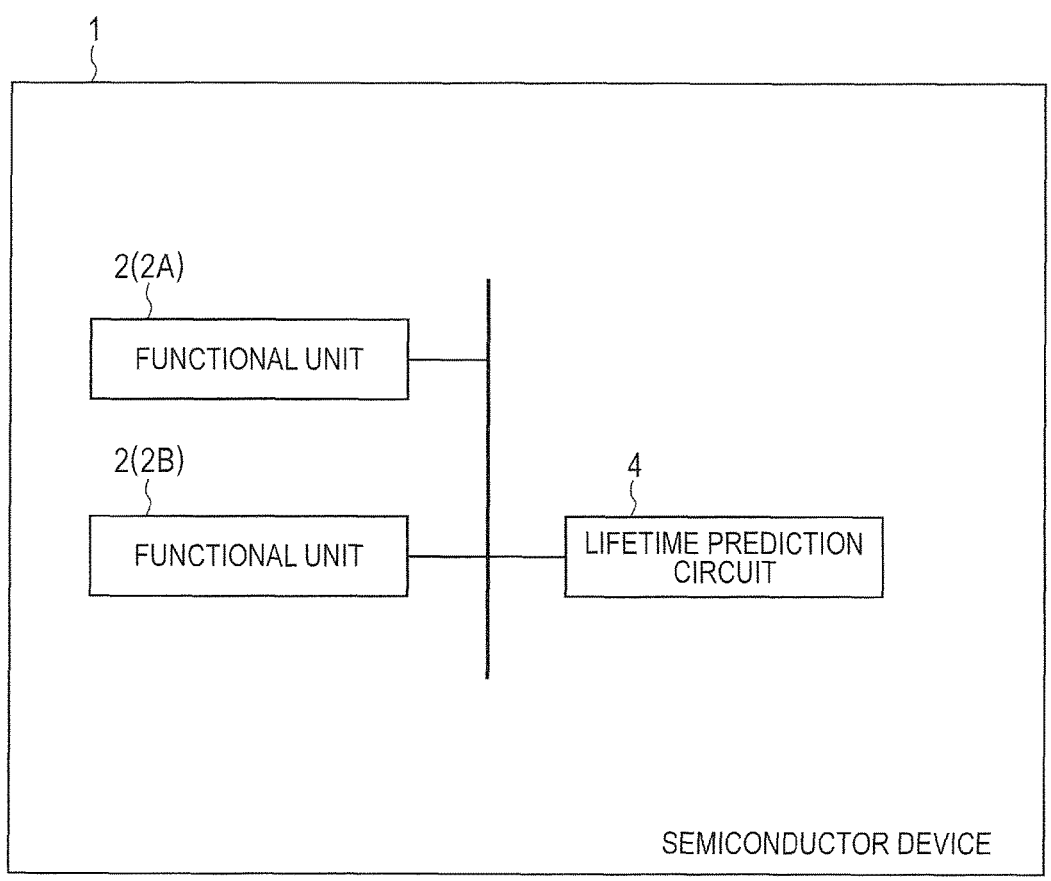
FIG. 1 is a diagram depicting an overview of a semiconductor device pertaining to an embodiment of the invention.

In the following, embodiments will be described with reference to the drawings. To clarify explanation, the following descriptions and drawings are appropriately left out and simplified. And now, in the drawings, identical elements are assigned identical reference signs and duplicative descriptions are omitted, as necessary.

In the following description of embodiments, an embodiment is divided into plural sections or embodiments, when necessary for convenience sake, and these sections or embodiments are described; unless otherwise specified, they are not independent of each other and they relate to one another such that one is an example of modification, an example of application, detailed description, supplementary description, etc. of another in part or whole. In the following description of embodiments, where the number of elements or the like (including the number of pieces, a numeric value, quantity, range, etc.) is mentioned, that number should not be limited to a particular number mentioned and may be more or less than the particular number, unless otherwise specified and unless that number is, in principle, obviously limited to the particular number.

Moreover, for an embodiment which will be described below, its components (including operation steps or the like) are not always necessary, unless otherwise specified and unless such components are, in principle, considered to be obviously necessary. Likewise, in an embodiment which will be described below, when the shape of a component or the like, a positional relation between components, etc. are described, such description should be construed to include those that are substantially similar or analogous to the shape or the like, unless otherwise specified and unless such description is, in principle, considered to be obviously exclusive. This is also true for the above number of elements or the like (including the number of pieces, a numeric value, quantity, range, etc.).

Moreover, elements which are described in drawings as functional blocks to perform various processing tasks can be configured, in a hardware aspect, with a CPU (Central Processing Unit), a memory, and other circuits and they are implemented, in a software aspect, with a program or the like which has been loaded into a memory. Therefore, it will be understood by those skilled in the art that these functional blocks can be implemented in various ways, i.e., by only hardware, only software, or hardware/software combination and their implementation is not limited to any one way.

Moreover, the above-mentioned program may be stored using various types of non-transitory computer readable media and can be supplied to a computer. The non-transitory computer readable media include various types of tangible storage media. Examples of the non-transitory computer readable media include, a magnetic recording medium (e.g., flexible disk, magnetic tape, or hard disk drive), a magneto-optical recording medium (e.g., magneto-optical disk), a CD-ROM (Read Only Memory), CD-R, CD-R/W, and a semiconductor memory (e.g., mask ROM, PROM (Programmable ROM), EPROM (Erasable PROM), flash ROM, or RAM (Random Access Memory). The program may also be supplied to a computer through various types of transitory computer readable media. Examples of the transitory computer readable media include electric signals, optical signals, and electromagnetic waves. The transitory computer readable media can supply the program to a computer via a wired communication path such as an electric wire and an optical fiber or via a wireless communication path.

GENERAL DESCRIPTION OF EMBODIMENTS

General aspects of embodiments of the invention are now described before describing the embodiments, respectively.

FIG. 1 is a diagram depicting an overview of a semiconductor device 1 pertaining to an embodiment of the invention. The semiconductor device 1 is, for example, a microcomputer such as a Micro Control Unit (MCU). The semiconductor device 1, for example, may be assembled in a vehicle as a component of an in-vehicle electronic equipment. In this case, the semiconductor device 1, for example, may be, but not limited to, an MCU or an Electronic Control Unit (ECU) for controlling the prime mover (e.g., engine) or the like of a vehicle such as an automobile.

As depicted in FIG. 1, the semiconductor device 1 includes a functional unit 2A (functional unit A), a functional unit 2B (functional unit B), and a lifetime prediction circuit 4. The functional units 2A, 2B are semiconductor circuits included in the semiconductor device 1. The functional units 2A, 2B, for example, may be, but not limited to, a CPU which is a central processing unit, RAM, ROM, or an I/O (Input/Output) circuit (which will simply be referred to as an "I/O" hereinafter). And now, in a context describing the functional units 2A and 2b without discriminating between them, they are each simply referred as a functional unit 2. Moreover, the semiconductor device 1 may include only one functional unit 2 or may include three or more functional units 2.

The lifetime prediction circuit 4 performs a lifetime prediction of the semiconductor device 1 by detecting deterioration of a functional unit 2. In other words, the lifetime prediction circuit 4 determines whether or not the semiconductor device 1 is close to its lifetime. Stated differently, the lifetime prediction circuit 4 determines whether or not the semiconductor device 1 is likely to become faulty. Concrete processing by the lifetime prediction circuit 4 will be described later. And now, although the lifetime prediction circuit 4 is provided separately from the functional units 2, as in FIG. 1, no limitation to this is intended. For instance, the functionality of the lifetime prediction circuit 4 may be implemented by the functional unit 2A which is, e.g., a CPU or the like. In this case, the lifetime prediction circuit 4 is the functional unit 2A. Moreover, the functionality of the lifetime prediction circuit 4 may be implemented by both the functional units 2A and 2B. In this case, the lifetime prediction circuit 4 is comprised of the functional units 2A and 2B.

Figure 2:
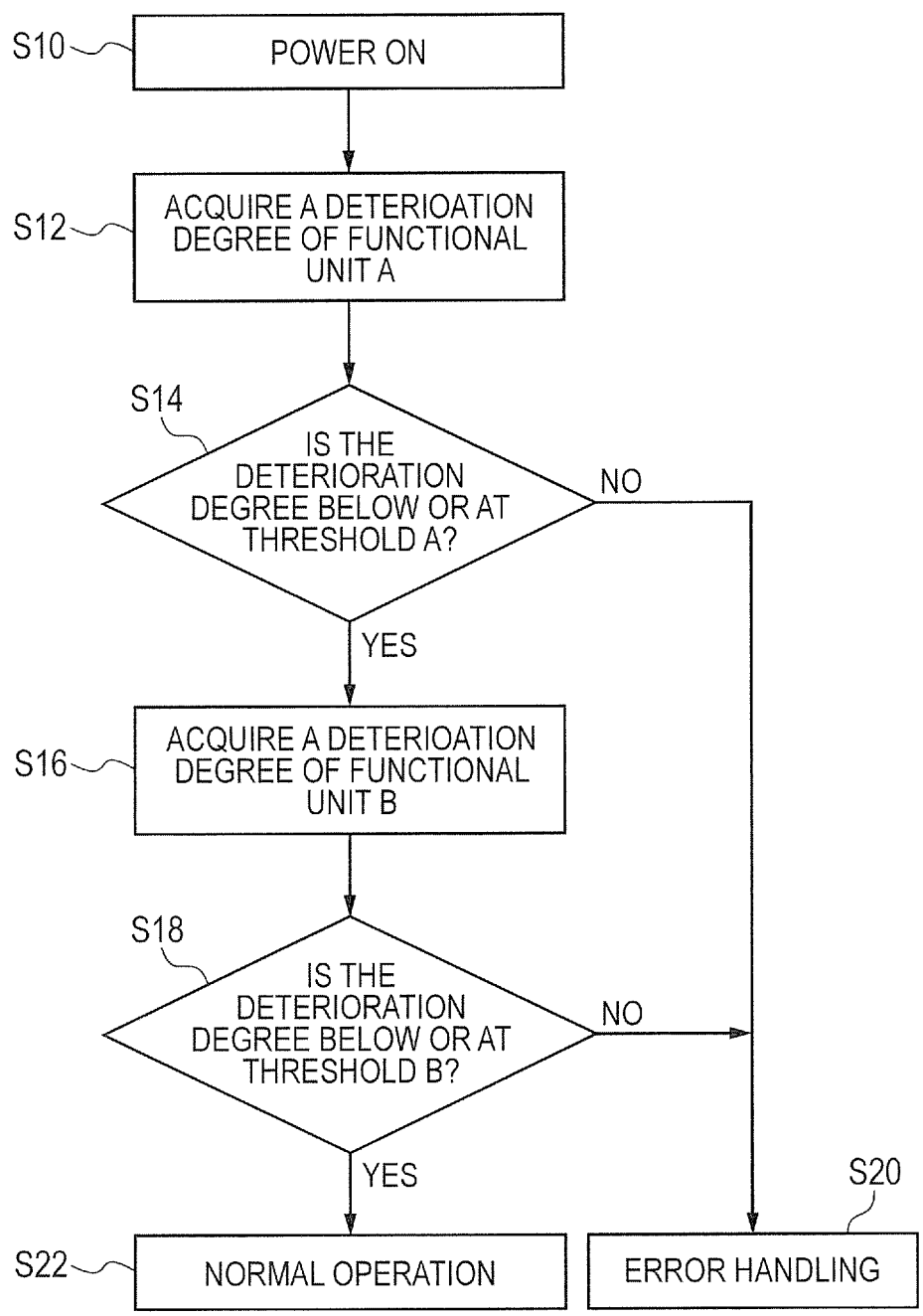
FIG. 2 is a flowchart illustrating a lifetime prediction method for the semiconductor device depicted in FIG. 1.

FIG. 2 is a flowchart illustrating a lifetime prediction method for the semiconductor device 1 depicted in FIG. 1. First, the semiconductor device 1 is powered on (step S10). Then, the lifetime prediction circuit 4 acquires a deterioration degree of the functional unit 2A (step S12). Here, a "deterioration degree is an index indicating a degree of how each functional unit 2 deteriorates. A concrete example of a deterioration degree will be described later. The lifetime prediction circuit 4 acquires a deterioration degree using a signal that is output from the functional unit 2. A concrete example of a signal that is output from the functional unit 2 will be described later.

Then, the lifetime prediction circuit 4 determines whether or not the deterioration degree of the functional unit 2A is below or at a predetermined threshold A (a first threshold) (step S14). And now, the lifetime prediction circuit 4 may have a function of making an analysis based on information such as an analog signal that is input from the functional unit 2, not only making the threshold based determination. If the deterioration degree is not below or at the threshold A, that is, if the deterioration degree is more than the threshold A (NO, as determined at S14), the lifetime prediction circuit 4 decides that the semiconductor device 1 is close to its lifetime. Then, the lifetime prediction circuit 4 performs error handling (step S20). Here, error handling is processing to make a notification that the semiconductor device 1 is close to its lifetime. Error handling is, for example, outputting a signal to cause a user interface, which is coupled to and enabled to communicate with the semiconductor device 1, to display a warning to indicate that the device is close to its lifetime. This error handling should be defined by a system user and is not mentioned in embodiments of the invention. As a consequence, a warning message such as "the MCU is close to its lifetime" can be displayed on the user interface.

Otherwise, if the deterioration degree is below or at the threshold A, that is, if the deterioration degree is not more than the threshold A (YES, as determined at S14), the lifetime prediction circuit 4 acquires a deterioration degree of the functional unit 2B (step S16), as done at step S12. Then, the lifetime prediction circuit 4 determines whether or not the deterioration degree of the functional unit 2B is below or at a predetermined threshold B (a first threshold) (step S18). And now, the threshold B may differ from the threshold A. If the deterioration degree is not below or at the threshold B, that is, if the deterioration degree is more than the threshold B (NO, as determined at S18), the lifetime prediction circuit 4 decides that the semiconductor device 1 is close to its lifetime. Then, the lifetime prediction circuit 4 performs error handing (step S20).

Otherwise, if the deterioration degree is below or at the threshold B, that is, the deterioration degree is not more than the threshold B (YES, as determined at S18), the semiconductor device 1 executes a normal operation (step S22). Here, the normal operation means that the semiconductor device 1 executes a startup operation (such as booting) to perform its primary functionality and performs its primary functionality.

The semiconductor device 1 pertaining to an embodiment of the invention acquires a deterioration degree indicating a degree of how a functional unit 2 deteriorates and, if the deterioration degree is more than a predetermined first threshold, executes processing to make a notification that the semiconductor device 1 is close to its lifetime. Therefore, before the semiconductor device 1 becomes faulty (i.e., as its lifetime has been reached), it is enabled to notify a user that the semiconductor device 1 is likely to become faulty before long. Accordingly, the user can take measures, such as replacing the semiconductor device 1 with a new one, before the semiconductor device 1 becomes faulty. Thus, it would become possible to prevent a malfunction of a product having the semiconductor device 1 assembled therein.

Upon the detection of a fatal fault in a semiconductor device, the semiconductor device is usually deactivated. Even in such an event, however, it is required not to deactivate the semiconductor device immediately in some situations. For instance, in an automatic driving assistance system in which vehicle driving is automatically controlled by an electronic equipment involving the semiconductor device, when the electronic equipment function has to be deactivated because of the fault of the semiconductor device, it is required to ensure a sufficient time before handing over the vehicle driving control to the driver and continue the operation safely during that time. In such a case, if there is a short time from the fault occurrence until the electronic equipment becomes failed to continue a safe operation, affected by the fault, it would be impossible to ensure a sufficient time before handing over the vehicle driving control to the driver. On the other hand, an embodiment of the invention makes it possible to alert the driver to take measures, such as replacing the semiconductor device 1 with a new one, before the semiconductor device 1 becomes faulty. Therefore, even if there is a short time before the electronic equipment becomes failed to continue a safe operation, it would become possible to prevent a malfunction of a product having the semiconductor device 1 assembled therein before it happens.

First Embodiment

A first embodiment is then described. In the first embodiment, an example where an MCU is a concrete example of the foregoing semiconductor device 1 is set forth.

Figure 3:
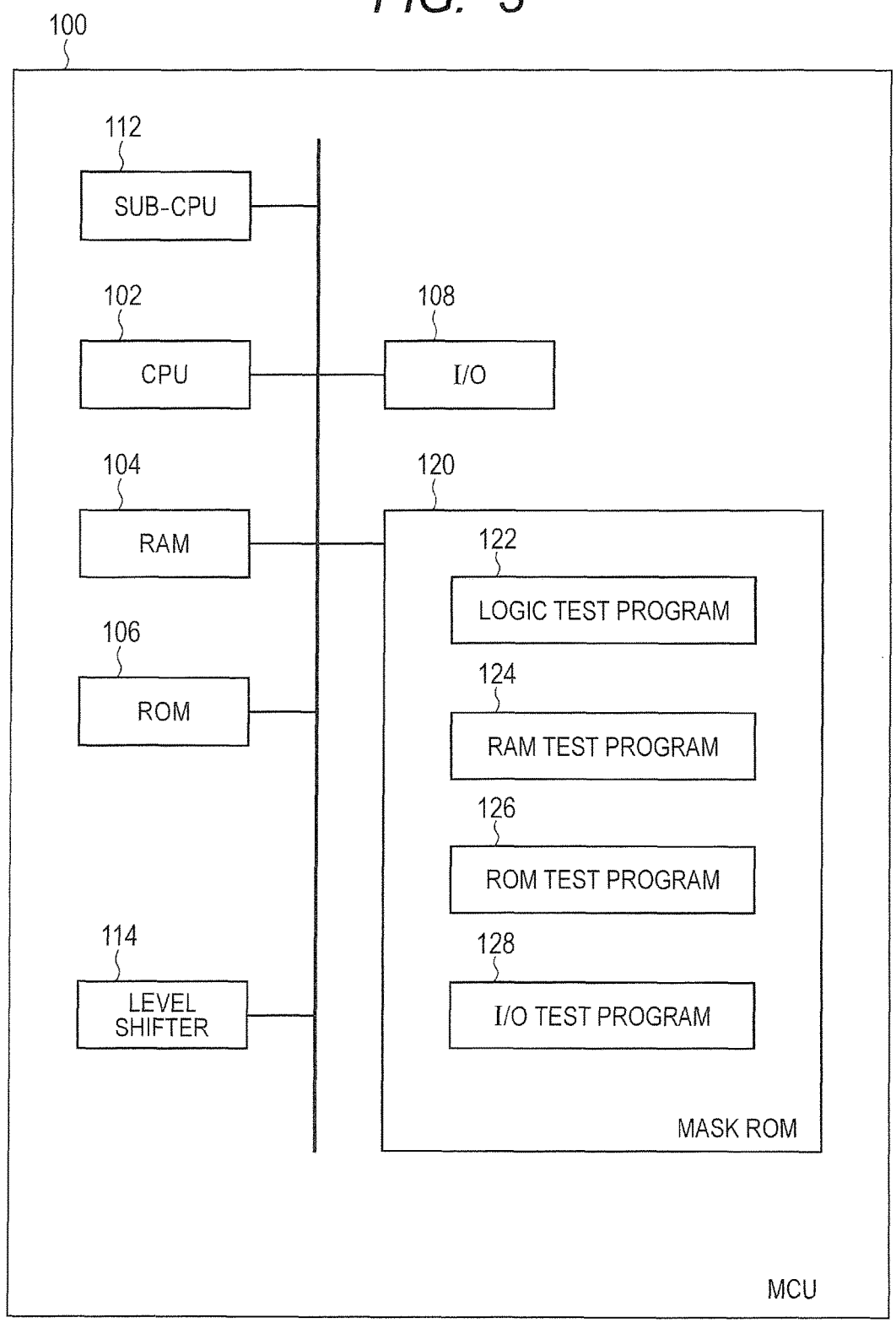
FIG. 3 is a diagram depicting a configuration of an MCU pertaining to a first embodiment.

FIG. 3 is a diagram depicting a configuration of an MCU 100 pertaining to the first embodiment. The MCU 100 includes a CPU 102, a RAM 104, a ROM 106, an I/O 108, a sub-CPU 112, a level shifter 114, and a mask ROM 120. These components are coupled to one another via a bus. And now, the CPU 102, RAM 104, ROM 106, and I/O 108 correspond to functional units 2 described previously. The sub-CPU 112 is a processing circuit to execute a test of the CPU 102, which will be described later. The level shifter 114 is hardware to adjust a power supply voltage Vdd of the MCU 100.

The mask ROM 120 stores a logic test program 122, a RAM test program 124, a ROM test program 126, and an I/O test program 128. The logic test program 122 is a program for carrying out a test of the CPU 102 (logic test). This logic test program 122 is executed by the sub-CPU 112. That is, when the logic test is executed, the sub-CPU 112 corresponds to the lifetime prediction circuit 4 described previously The RAM test program 124 is a program for carrying out a test of the RAM 104 (RAM test). The ROM test program 126 is a program for carrying out a test of the ROM 106 (ROM test). The I/O test program 128 is a program for carrying out a test of the I/O 108 (I/O test). These RAM test program 124, ROM test program 126, and I/O test program 128 are executed by the CPU 102. That is, when the RAM test, ROM test, and I/O test are executed, the CPU 102 corresponds to the lifetime prediction circuit 4 described previously. Processing details of the logic test, RAM test, ROM test, and I/O test will be described later. And now, if a circuit that makes a threshold based determination malfunctions, the RAM test and subsequent tests do not run properly; therefore, the test for the CPU (logic test) is first executed. Since the CPU 102 executes a program using the RAM 104, the RAM test is next executed. Since a program is stored in the ROM 106, the ROM test is next executed. Lastly, the I/O test is executed. And now, a sequence in which the tests are executed is not limited to the above-mentioned sequence and may be changed, as appropriate. The sequence in which the tests are executed may, for example, be determined from fault occurrence probability specific to a semiconductor circuit.

Here, the mask ROM is a memory that is resistant to aging deterioration. Therefore, it is possible to suppress deterioration of the programs, even if any other functional unit of the MCU 100 has deteriorated. Thereby, it is enabled to execute the tests certainly even if a functional unit has deteriorated.

Moreover, in the first embodiment, the CPU 102 carries out the tests other than the test of the CPU 102 (logic test), as described above. This dispenses with a circuit that exclusively carries out the tests of the functional units other than the CPU 102. Consequently, it is possible to suppress an increase in the circuit size of the MCU 100 (semiconductor device).

By carrying out the logic test, RAM test, ROM test, and I/O test, a deterioration ratio of the CPU 102, RAM 104, ROM 106, and I/O 108 is acquired, respectively. Here, a "deterioration ratio" is a concrete example of a deterioration degree mentioned previously. A deterioration ratio, for example, indicates a proportion of the number of deteriorated elements to a total number of multiple elements (transistors, among others) constituting each functional unit. Alternatively, a deterioration ratio (deterioration degree) may be an average, maximum, or minimum of characteristic values of a single body (a transistor or functional unit). And now, particular processing details of the logic test, RAM test, ROM test, and I/O test will be described with FIG. 6 and FIG. 7.

Moreover, the MCU 100 compares a deterioration ratio of each functional unit with a value predetermined for each functional unit and determines whether or not the deterioration ratio is below or at a threshold, as will be described later. If the deterioration ratio is more than the threshold, it is determined that the MCU 100 is close to its lifetime. A description about this threshold is provided below in conjunction with FIG. 4.

Figure 4:
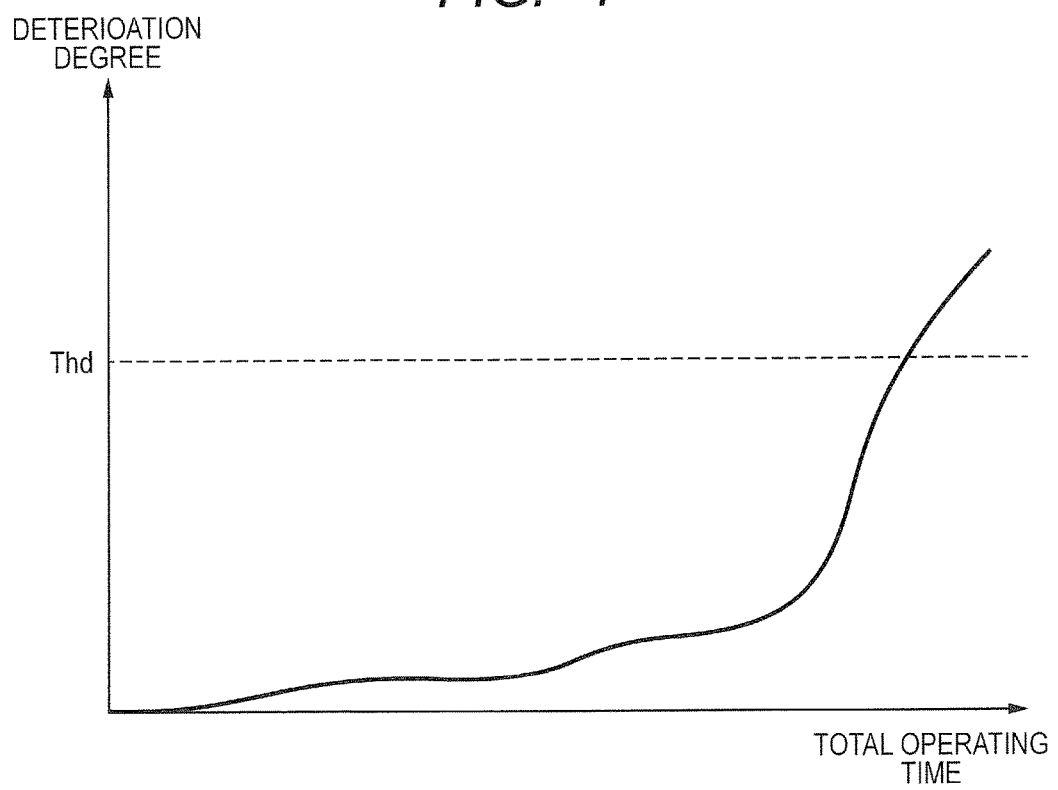
FIG. 4 is a graph representing a relation between the total operating time of the MCU and a functional unit's deterioration degree.

FIG. 4 is a graph representing a relation between the total operating time of the MCU 100 and a functional unit's deterioration degree. In the graph presented in FIG. 4, the abscissa indicates the total operating time of the MCU 100 and the ordinate indicates a functional unit's deterioration degree. As mentioned previously, a concrete example of a deterioration degree is a deterioration ratio in the first embodiment. As the total operating time of the MCU 100 increases, each functional unit's deterioration ratio (deterioration degree) increases. That is, as the total operating time of the MCU 100 increases, there is a progression of deterioration of each functional unit. When the deterioration degree has become more than a predetermined threshold Thd, it is determined that the MCU is close to its lifetime. In other words, the threshold Thd is a value above which a determination that the MCU 100 is close to its lifetime can be made.

Therefore, the MCU 100 compares a functional unit's deterioration ratio with this threshold Thd. And now, this threshold Thd may differ with respect to each functional unit (CPU 102, RAM 104, ROM 106, and I/O 108). That is, a threshold for a deterioration ratio of the CPU 102, a threshold for a deterioration ratio of the RAM 104, a threshold for a deterioration ratio of the ROM 106, and a threshold for a deterioration ratio of the I/O 108 may differ from one another. That is, a threshold Thd can appropriately be set for each functional unit. In this case, a threshold may be set according to importance of a functional unit. That is, a smaller threshold may be set for a more important functional unit. For example, a threshold for a deterioration degree of the CPU 102 may be smaller than a threshold for a deterioration degree of the ROM 106.

Here, it is preferable that a threshold Thd is within the error correction capability of each functional unit. In particular, a functional unit that is comprised of multiple cells, such as, e.g., a RAM or ROM, may be provided with an error correction function using ECC (Error-Correction Code) or the like. Here, an error ratio of data that has been output from the functional unit tends to increase with an increase in its deterioration degree. Therefore, it is preferable to set a threshold Thd, so that errors to an extent not exceeding the error correction capability of the functional unit will be corrected and it will be determined that the MCU 100 is close to its lifetime, if there are errors beyond the limit of the error correction capability of the functional units. Specifically, a threshold Thd may, for example, be set within 5 to 10%.

Figure 5:
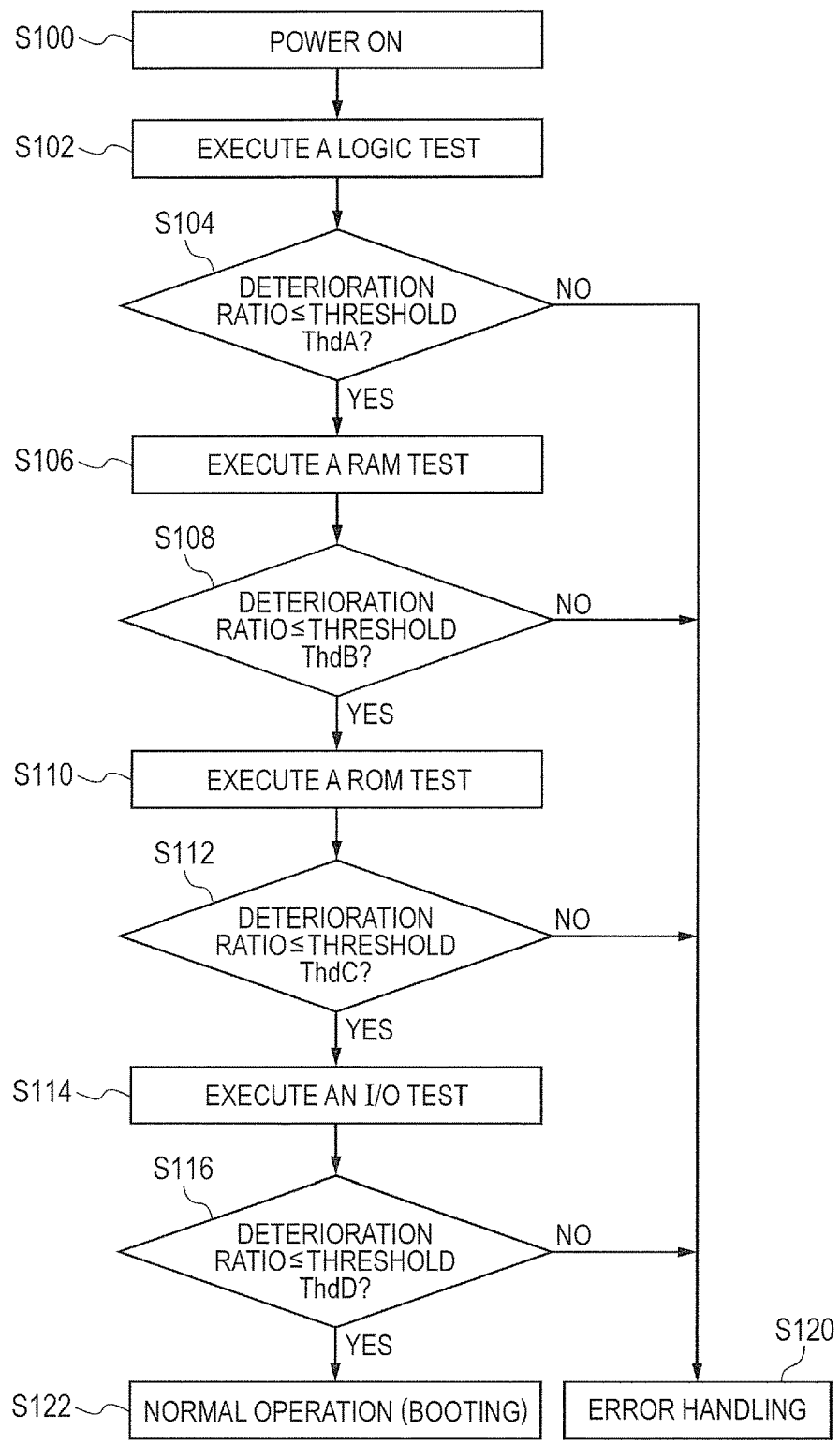
FIG. 5 is a flowchart illustrating a lifetime prediction method for the MCU pertaining to the first embodiment.

FIG. 5 is a flowchart illustrating a lifetime prediction method for the MCU 100 pertaining to the first embodiment. First, the MCU 100 is powered on (step S100). Then, the MCU 100 executes a logic test of the CPU 102 (step S102). In particular, the sub-CPU 112 executes the logic test program 122; thereby, the logic test is carried out. Thus, the sub-CPU 112 acquires a deterioration ratio of the CPU 102.

Next, the sub-CPU 112 of the MCU 100 determines whether or not the deterioration ratio of the CPU 102 is below or at a threshold ThdA (a first threshold) (step S104). Here, the threshold ThdA is a threshold Thd predetermined for the CPU 102. If the deterioration ratio of the CPU 102 is not below or at the threshold ThdA, that is, if the deterioration ratio is more than the threshold ThdA (NO, as determined at S104), the sub-CPU 112 determines that deterioration of the CPU 102 progresses to an extent that the MCU 100 is close to its lifetime. Then, the sub-CPU 112 performs error handling predefined for the MCU 100 (step S120).

Otherwise, if the deterioration ratio of the CPU 102 is below or at the threshold ThdA, that is, if the deterioration ratio is not more than the threshold ThdA (YES, as determined at S104), the MCU 100 executes a RAM test of the RAM 104 (step S106). In particular, the CPU 102 executes the RAM test program 124; thereby, the RAM test is carried out. Thus, the CPU 102 acquires a deterioration ratio of the RAM 104.

Next, the CPU 102 of the MCU 100 determines whether or not the deterioration ratio of the RAM 104 is below or at a threshold ThdB (a first threshold) (step S108). Here, the threshold ThdB is a threshold Thd predetermined for the RAM 104. If the deterioration ratio of the RAM 104 is not below or at the threshold ThdB, that is, if the deterioration ratio is more than the threshold ThdB (NO, as determined at S108), the CPU 102 determines that deterioration of the RAM 104 progresses to an extent that the MCU 100 is close to its lifetime. Then, the CPU 102 performs error handling as mentioned above (step S120).

Otherwise, if the deterioration ratio of the RAM 104 is below or at the threshold ThdB, that is, if the deterioration ratio is not more than the threshold ThdB (YES, as determined at S108), the MCU 100 executes a ROM test of the ROM 106 (step S110). In particular, the CPU 102 executes the ROM test program 126; thereby, the ROM test is carried out. Thus, the CPU 102 acquires a deterioration ratio of the ROM 106.

Next, the CPU 102 of the MCU 100 determines whether or not the deterioration ratio of the ROM 106 is below or at a threshold ThdC (a first threshold) (step S112). Here, the threshold ThdC is a threshold Thd predetermined for the ROM 106. If the deterioration ratio of the ROM 106 is not below or at the threshold ThdC, that is, if the deterioration ratio is more than the threshold ThdC (NO, as determined at S112), the CPU 102 determines that deterioration of the ROM 106 progresses to an extent that the MCU 100 is close to its lifetime. Then, the CPU 102 performs error handling as mentioned above (step S120).

Otherwise, if the deterioration ratio of the ROM 106 is below or at the threshold ThdC, that is, if the deterioration ratio is not more than the threshold ThdC (YES, as determined at S112), the MCU 100 executes an I/O test of the I/O 108 (step S114). In particular, the CPU 102 executes the I/O test program 128; thereby, the I/O test is carried out. Thus, the CPU 102 acquires a deterioration ratio of the I/O 108.

Next, the CPU 102 of the MCU 100 determines whether or not the deterioration ratio of the I/O 108 is below or at a threshold ThdD (a first threshold) (step S116). Here, the threshold ThdD is a threshold Thd predetermined for the I/O 108. If the deterioration ratio of the I/O 108 is not below or at the threshold ThdD, that is, if the deterioration ratio is more than the threshold ThdD (NO, as determined at S116), the CPU 102 determines that deterioration of the I/O 108 progresses to an extent that the MCU 100 is close to its lifetime. Then, the CPU 102 performs error handling as mentioned above (step S120).

Otherwise, if the deterioration ratio of the I/O 108 is below or at the threshold ThdD, that is, if the deterioration ratio is not more than the threshold ThdD (YES, as determined at S116), the CPU 102 determines that all the functional units do not deteriorate to an extent that the MCU 100 is close to its lifetime. Then, the MCU 100 executes a normal operation as described previously (step S122).

A description is then provided about the logic test, RAM test, ROM test, and I/O test. The logic test, RAM test, ROM test, and I/O test are based on a deterioration characteristic of semiconductor elements (transistors, among others) constituting a functional unit. A description about the tests pertaining to the first embodiment is provided below in conjunction with FIG. 6.

Figure 6:
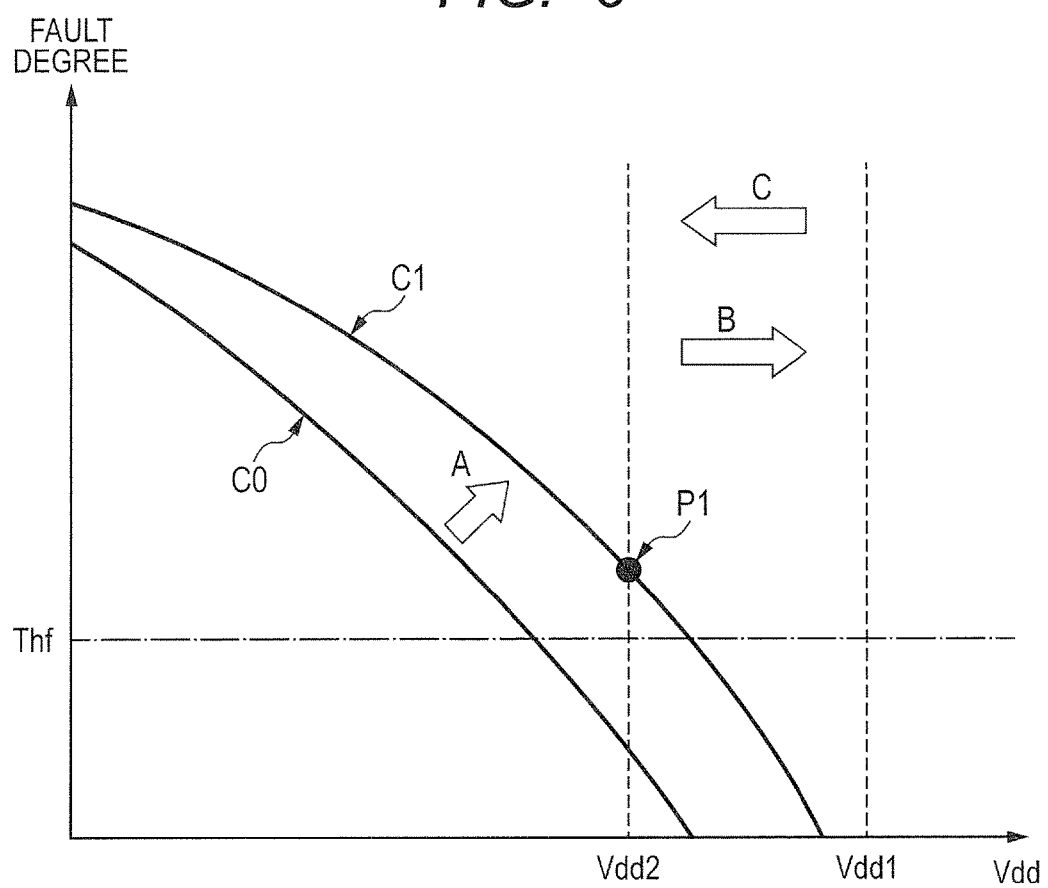
FIG. 6 is a graph representing a characteristic of a semiconductor element in an instance where the semiconductor elements are transistors.

FIG. 6 is a graph representing a characteristic of a semiconductor element in an instance where the semiconductor elements are transistors. In the graph presented in FIG. 6, the abscissa indicates a power supply voltage (operating voltage) Vdd of a semiconductor element (transistor) and the ordinate indicates a fault degree of the semiconductor element (transistor). Here, a fault degree is an index indicating the reliability of the semiconductor element and a larger value of it is indicative of lower reliability. For example, a fault degree may be, but not limited to, FIT (Failure In Time). Moreover, a threshold Thf is denoted by a dot-and-dash line. The threshold Thf is a criterion above which an error is liable to occur in the semiconductor element.

Moreover, a characteristic curve C0 represents an element characteristic before shipment of the MCU 100. Another characteristic curve C1 represents an element characteristic along with deterioration of the semiconductor element after shipment of the MCU 100. Here, as indicated by the characteristic curves, the higher the power supply voltage Vdd, the lower will be the fault degree. Besides, when the semiconductor element deteriorates due to, inter alia, NBTI (Negative Bias Temperature Instability) deterioration, the characteristic curve of the semiconductor element shifts from the characteristic curve C0 to the characteristic curve C1, as indicated by an arrow A. Since this shift causes a threshold voltage to rise, the power supply voltage Vdd is modified to a higher voltage, as indicated by an arrow B, to prevent an error from occurring. That is, an operation margin of the semiconductor device can thus be ensured. Specifically, raising the power supply voltage Vdd to Vdd1 in the condition of the characteristic curve C1 prevents an error from occurring, because the fault degree at this operating voltage Vdd1 is less than the threshold Thf. By doing so, it is possible to extend the lifetime of a functional unit.

Here, when a lifetime prediction of the MCU 100 is performed, the power supply voltage Vdd is to be decreased from the operating voltage Vdd1 to a test voltage Vdd2, as indicated by an arrow C. When a test is carried out in this condition, the fault degree becomes a value at a point denoted by P1 and this value is more than the threshold Thf. In this case, it is determined that the semiconductor element deteriorates. The tests pertaining to the first embodiment are carried out so that a deterioration ratio of a functional unit will be acquired from a value that is detected by thus decreasing the power supply voltage Vdd from the operating voltage Vdd1 to the test voltage Vdd2. And now, it is preferable that a fall range (Vdd1-Vdd2) of the power supply voltage Vdd is 10 to 20%, but no limitation to this is intended.

Figure 7:
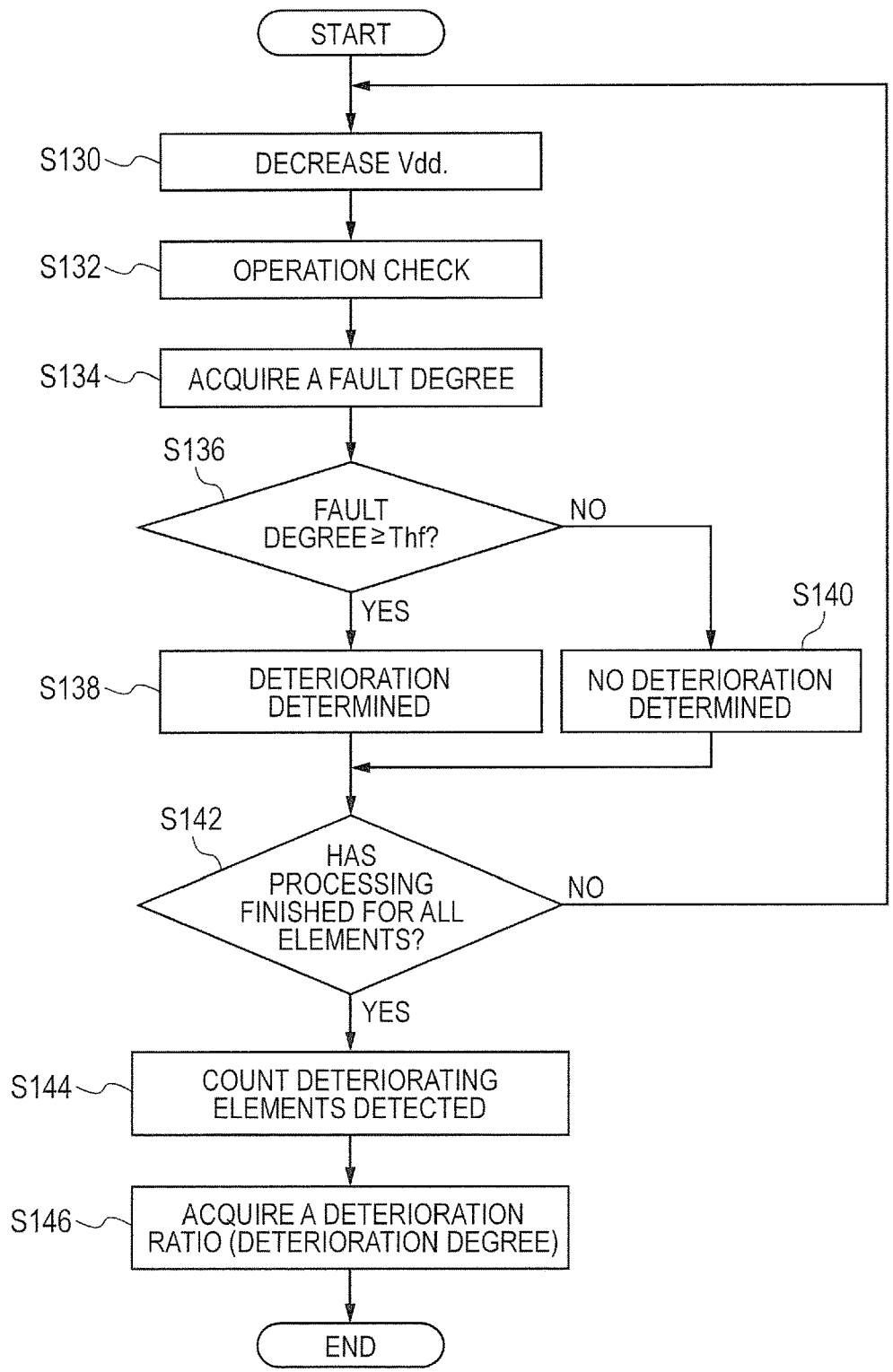
FIG. 7 is a flowchart illustrating the processing details of tests pertaining to the first embodiment.

FIG. 7 is a flowchart illustrating the processing details of the tests (logic test, RAM test, ROM test, and I/O test) pertaining to the first embodiment. The flowchart presented in FIG. 7 concerns processing of S102, S106, S110, and S114 in the flowchart presented in FIG. 5. Here, in the case of a logic test, the flowchart presented in FIG. 7 is carried out by the sub-CPU 112 in executing a test program (the logic test program 122), as described previously. In the cases of a RAM test, a ROM test, and an I/O test, the flowchart presented in FIG. 7 is carried out by the CPU 102 in executing a test program (the RAM test program 124, ROM test program 126, and I/O test program 128). In the following description, the sub-CPU 112 is assumed to execute the processing; however, the CPU 102 likewise executes the same processing.

According to the test program, the sub-CPU 112 first performs control to decrease the power supply voltage Vdd of a semiconductor element (step S130). In particular, the sub-CPU 112 controls the level shifter 114 to decrease the power supply voltage Vdd. Thereby, the power supply voltage Vdd decreases from the operating voltage Vdd1 to the test voltage Vdd2.

In this condition, sub-CPU 112 then performs an operation check of the semiconductor element (step S132). Thereby, the sub-CPU 112 acquires a fault degree of the semiconductor element (step S134). At this time, the sub-CPU 112 acquires a fault degree according to a signal output from the functional unit. Here, the "operation check" is processing (a test) for acquiring a fault degree. For instance, the sub-CPU 112 outputs challenge data (a data string) to the semiconductor element and detects an error ratio from response data (a signal) from the semiconductor element; this error ratio may be taken as a fault degree.

Then, the sub-CPU 112 determines whether or not the acquired fault degree is above or at the threshold Thf (step S136). If the fault degree is above or at the threshold Thf (YES, as determined at S136), the sub-CPU 112 determines that this semiconductor element deteriorates (step S138). Otherwise, if the fault degree is not above or at the threshold Thf (NO, as determined at S136), the sub-CPU 112 determines that this semiconductor element does not deteriorate (step S140). And now, in this case, when the fault degree is above or at the threshold Thf at the test voltage Vdd2, whereas the fault degree is not above or at the threshold Thf at the operating voltage Vdd1, the sub-CPU 112 may determine that the semiconductor element deteriorates.

Next, the sub-CPU 112 determines whether or not the foregoing processing (S130 to S140) has finished for all semiconductor elements to be tested in the functional unit (CPU 102) (step S142). If the processing has not finished for all semiconductor elements (NO, as determined at S142), the sub-CPU 112 repeats the processing of S130 to S140 for another semiconductor element. And now, the sub-CPU 112 may execute the foregoing processing (S130 to S140) for two or more semiconductor elements concurrently. If the processing is concurrently executed for all semiconductor elements, the processing step of S142 is dispensed with.

Otherwise, if the processing has finished for all semiconductor elements (YES, as determined at S142), the sub-CPU 112 counts semiconductor elements detected as deteriorating ones (step S144). Then, the sub-CPU 112 acquires a deterioration ratio (step S146). In particular, the sub-CPU 112 acquires a proportion of the number of semiconductor elements detected as deteriorating ones to the number of all semiconductor elements as a deterioration ratio. And now, if a deterioration ratio (deterioration degree) is an average, maximum, or minimum of characteristic values of a single body (a transistor or functional unit), the sub-CPU 112 (or the CPU 102) may acquire an average, maximum, or minimum of such characteristic values as a deterioration ratio. Then, if the thus acquired value is more than its threshold Thd, the sub-CPU 112 (or the CPU 102) may determine that the MCU 100 is close to its lifetime.

The MCU 100 pertaining to the first embodiment acquires a deterioration ratio (deterioration degree) of each of the functional units and, if the deterioration ratio of each is more than a predetermined threshold Thd, the MCU 100 executes processing to make a notification that the MCU 100 is close to its lifetime. Therefore, before the MCU 100 becomes faulty (i.e., as its lifetime has been reached), it is enabled to notify a user that the MCU 100 is likely to become faulty before long. Accordingly, the user can take measures, such as replacing the MCU 100 with a new one, before the MCU 100 becomes faulty.

Moreover, in the first embodiment, a lifetime prediction of the MCU 100 can be performed through the use of a simple method in which the power supply voltage is decreased and then a test is carried out. Therefore, there is no need for equipping the MCU 100 with an additional circuit that exclusively performs a lifetime prediction. Consequently, in the first embodiment, it is enabled to perform a lifetime prediction, while suppressing an increase in the circuit size.

Second Embodiment

Then, a second embodiment is described. The second embodiment differs from the first embodiment in the following respect: a test method for acquiring a deterioration degree is processing based on a PUF (Physically Unclonable Function). As is the case for the first embodiment, an example where an MCU is a concrete example of the semiconductor device 1 is set forth also in the second embodiment.

Here, the PUF is a technique for cipher code generation using a slight variance in electronic circuit properties that differs for each semiconductor circuit (functional unit). In other words, the PUF is a technique for generating a unique identifier (ID) of a semiconductor circuit using a physical variation in the properties of the semiconductor circuit. In particular, challenge data (PUF source) is input to a semiconductor circuit and response data (a PUF value) that is an initial value of a unique ID of the semiconductor circuit is acquired from the semiconductor circuit. Then, an error correction is performed on this response data, so that a unique ID of the semiconductor circuit is generated. A series of these processing steps will be referred to as PUF processing hereinafter.

Here, since a physical variation in the properties of a semiconductor circuit is used in the PUF, PUF processing is influenced by deterioration of a semiconductor circuit. That is, as a semiconductor circuit deteriorates, the error ratio of response data increases. Therefore, a circuit that executes PUF processing can be said to be a device having a high sensitivity in detecting deterioration of a semiconductor circuit. In the second embodiment, a lifetime prediction of the semiconductor device is performed, exploiting the fact that the error ratio increase, as a semiconductor circuit deteriorates.

Figure 8:
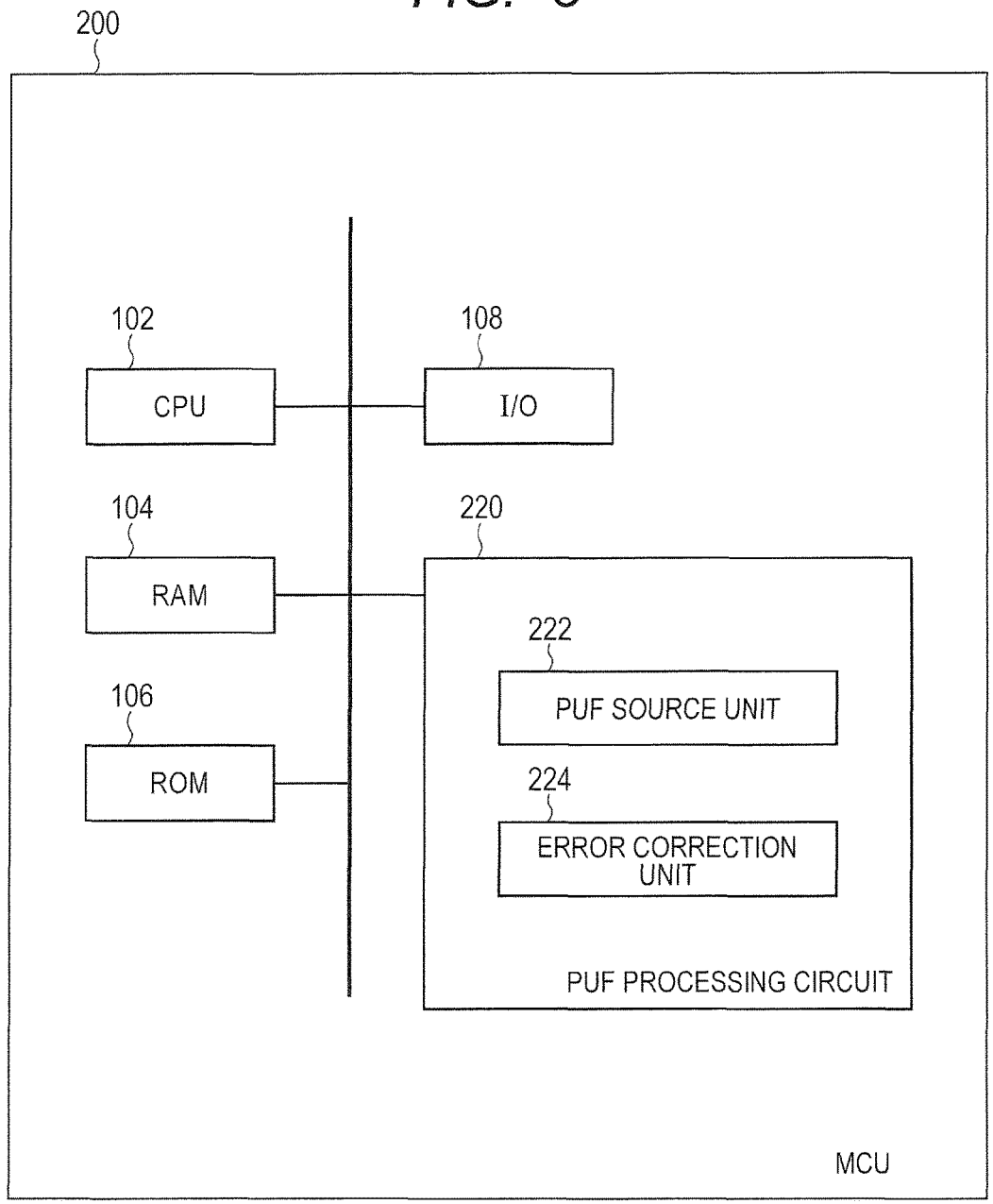
FIG. 8 is a diagram depicting a configuration of an MCU pertaining to a second embodiment.

FIG. 8 is a diagram depicting a configuration of an MCU 200 pertaining to the second embodiment. The MCU 200 includes a CPU 102, a RAM 104, a ROM 106, an I/O 108, and a PUF processing circuit 220. The PUF processing circuit 220 executes PUF processing. The PUF processing circuit 220 includes a PUF source unit 222 and an error correction unit 224.

The PUF processing circuit 220 executes PUF processing which will be described later and makes an error correction, thereby acquiring an error ratio. Details hereof will be described later. The PUF source unit 222 stores PUF source (source data) which is challenge data. The PUF source unit 222 outputs PUF source data stored therein to a functional unit. The error correction unit 224 acquires an initial value (PUF value) which is response data from the functional unit. The error correction unit 224 executes an error correction on the initial value and generates a unique ID of the functional unit.

And now, in the second embodiment, the PUF processing circuit 220 corresponds to the foregoing lifetime prediction circuit 4. In the second embodiment, a concrete example of a deterioration degree is an error ratio. That is, in the second embodiment, the ordinate of the graph presented in FIG. 4 indicates an error ratio.

Figure 9:
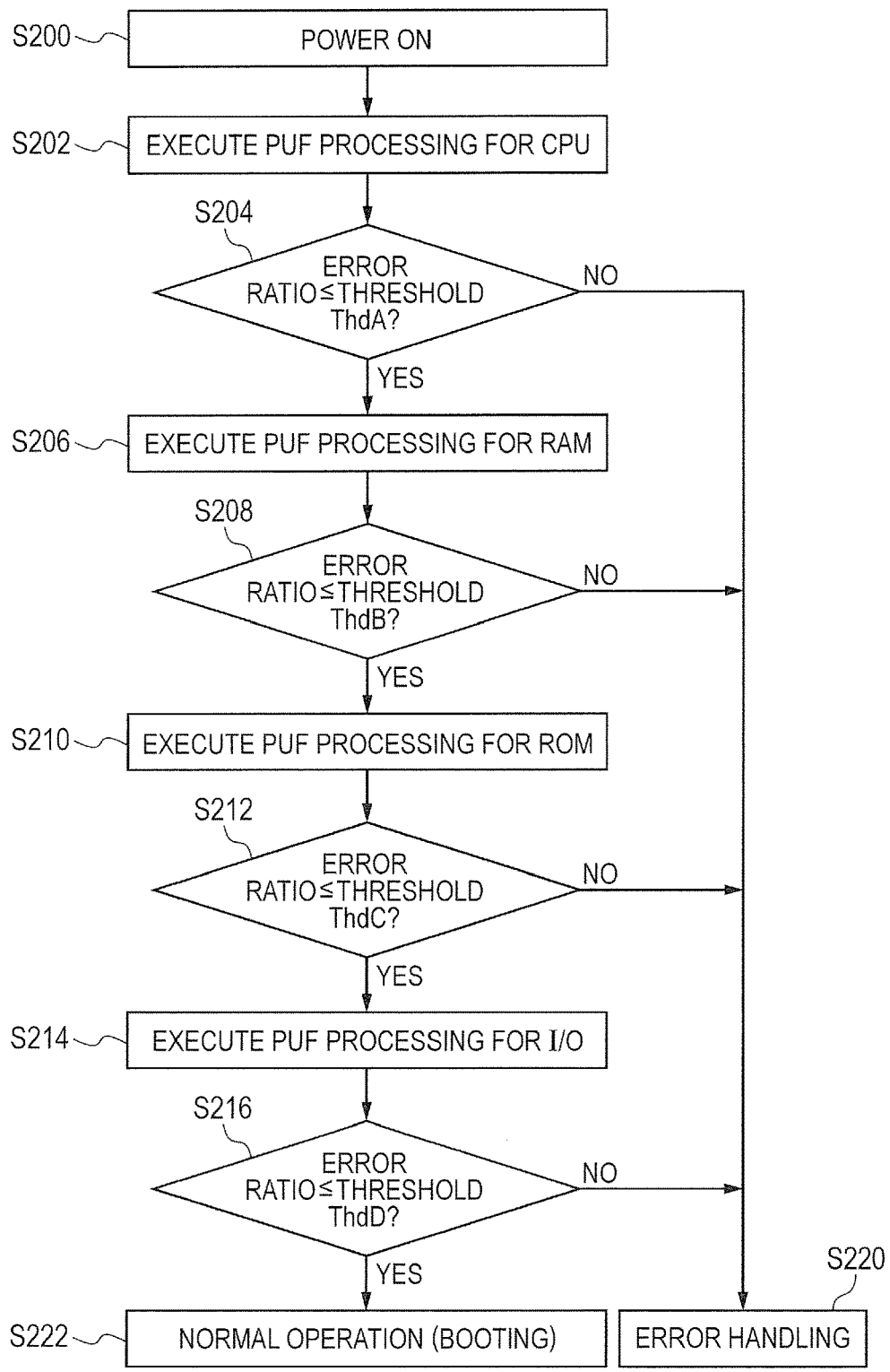
FIG. 9 is a flowchart illustrating a lifetime prediction method for the MCU pertaining to the second embodiment.

FIG. 9 is a flowchart illustrating a lifetime prediction method for the MCU 200 pertaining to the second embodiment. First, the MCU 200 is powered on (step S200). Then, the MCU 200 executes PUF processing for the CPU 102 (step S202). In particular, the PUF processing circuit 220 executes PUF processing which will be described later with FIG. 10. Thereby, the PUF processing circuit 220 acquires an error ratio of the CPU 102.

Next, the PUF processing circuit 220 of the MCU 200 determines whether or not the error ratio of the CPU 102 is below or at a threshold ThdA (a first threshold) (step S204). Here, the threshold ThdA is a threshold Thd predetermined for the CPU 102 and may be the same as the threshold ThdA pertaining to the first embodiment. If the error ratio of the CPU 102 is not below or at the threshold ThdA, that is, if the error ratio is more than the threshold ThdA (NO, as determined at S204), the PUF processing circuit 220 determines that deterioration of the CPU 102 progresses to an extent that the MCU 200 is close to its lifetime. Then, the PUF processing circuit 220 (or the CPU 102) performs error handling as described previously (step S220).

Otherwise, if the error ratio of the CPU 102 is below or at the threshold ThdA, that is, if the error ratio is not more than the threshold ThdA (YES, as determined at S204), the PUF processing circuit 220 executes PDF processing for the RAM 104 (step S206). Thereby, the PUF processing circuit 220 acquires an error ratio of the RAM 104.

Next, the PUF processing circuit 220 determines whether or not the error ratio of the RAM 104 is below or at a threshold ThdB (a first threshold) (step S208). Here, the threshold ThdB is a threshold Thd predetermined for the RAM 104 and may be the same as the threshold ThdB pertaining to the first embodiment. If the error ratio of the RAM 104 is not below or at the threshold ThdB, that is, if the error ratio is more than the threshold ThdB (NO, as determined at S208), the PUF processing circuit 220 determines that deterioration of the RAM 104 progresses to an extent that the MCU 200 is close to its lifetime. Then, the PUF processing circuit 220 (or the CPU 102) performs error handling (step S220).

Otherwise, if the error ratio of the RAM 104 is below or at the threshold ThdB, that is, if the error ratio is not more than the threshold ThdB (YES, as determined at S208), the PUF processing circuit 220 executes PUF processing for the ROM 106 (step S210). Thereby, the PUF processing circuit 220 acquires an error ratio of the ROM 106.

Next, the PUF processing circuit 220 determines whether or not the error ratio of the ROM 106 is below or at a threshold ThdC (a first threshold) (step S212). Here, the threshold ThdC is a threshold Thd predetermined for the ROM 106 and may be the same as the threshold ThdC pertaining to the first embodiment. If the error ratio of the ROM 106 is not below or at the threshold ThdC, that is, if the error ratio is more than the threshold ThdC (NO, as determined at S212), the PUF processing circuit 220 determines that deterioration of the ROM 106 progresses to an extent that the MCU 200 is close to its lifetime. Then, the PUF processing circuit 220 (or the CPU 102) performs error handling (step S220).

Otherwise, if the error ratio of the ROM 106 is below or at the threshold ThdC, that is, if the error ratio is not more than the threshold ThdC (YES, as determined at S212), the PUF processing circuit 220 executes PUF processing for the I/O 108 (step S214). Thereby, the PUF processing circuit 220 acquires an error ratio of the I/O 108.

Next, the PUF processing circuit 220 determines whether or not the error ratio of the I/O 108 is below or at a threshold ThdD (a first threshold) (step S216). Here, the threshold ThdD is a threshold Thd predetermined for the I/O 108 and may be the same as the threshold ThdD pertaining to the first embodiment. If the error ratio of the I/O 108 is not below or at the threshold ThdD, that is, if the error ratio is more than the threshold ThdD (NO, as determined at S216), the PUF processing circuit 220 determines that deterioration of the I/O 108 progresses to an extent that the MCU 200 is close to its lifetime. Then, the PUF processing circuit 220 (or the CPU 102) performs error handling (step S220).

Otherwise, if the error ratio of the I/O 108 is below or at the threshold ThdD, that is, if the error ratio is not more than the threshold ThdD (YES, as determined at S216), the PUF processing circuit 220 determines that all the functional units do not deteriorate to an extent that the MCU 200 is close to its lifetime. Then, the MCU 200 executes a normal operation as described previously (step S222).

Figure 10:
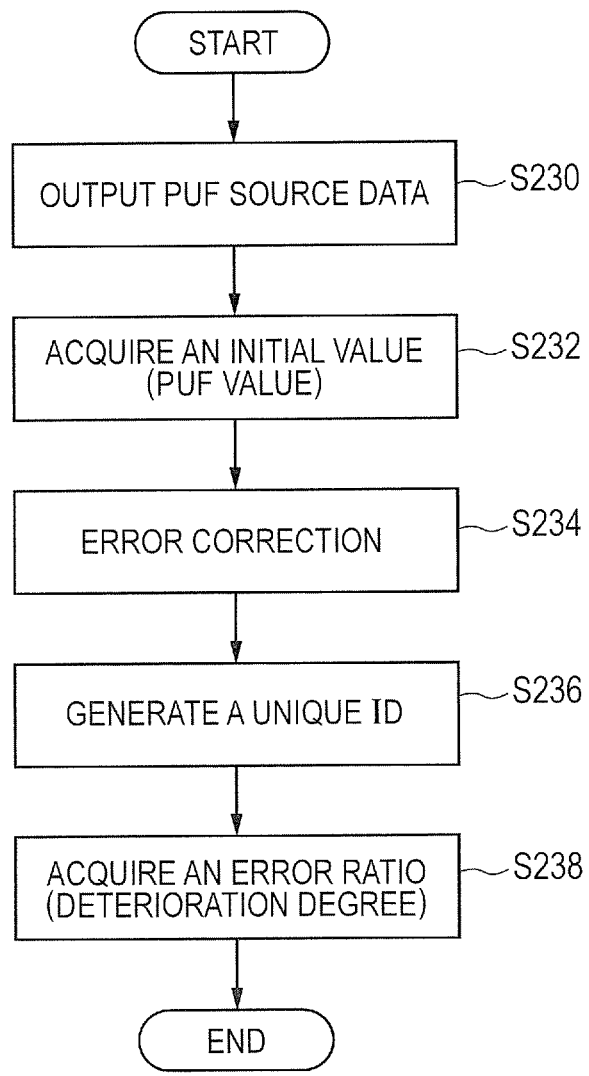
FIG. 10 is a flowchart illustrating the details of PUF processing pertaining to the second embodiment.

Then, PUF processing is described with FIG. 10.

FIG. 10 is a flowchart illustrating the details of PUF processing pertaining to the second embodiment. The flowchart presented in FIG. 10 concerns processing of S202, S206, S210, and S214 in the flowchart presented in FIG. 9.

First, the PUF source unit 222 in the PUF processing circuit 220 outputs PUF source data which is challenge data to a functional unit such as the CPU 102 (step S230). The functional unit to which the PUF source data has been input generates an initial value (PUF value) of a unique ID which is response data. The error correction unit 224 reads out this initial value (step S232). In other words, the PUF processing circuit 220 acquires the initial value according to a signal that has been output from the functional unit.

The error correction unit 224 executes an error correction on the initial value (step S234). Then, the error correction unit 224 generates a unique ID (step S236). The error correction unit 224 also acquires an error ratio (step S238). In particular, upon the error correction, the error correction unit 224 acquires a proportion of error-corrected bits in the data string of the initial value as an error ratio.

The MCU 200 pertaining to the second embodiment acquires an error ratio (deterioration degree) of each of the functional units and, if the error ratio of each is more than a predetermined threshold Thd, the MCU 200 executes processing to make a notification that the MCU 200 is close to its lifetime. Therefore, before the MCU 200 becomes faulty (i.e., as its lifetime has been reached), it is enabled to notify a user that the MCU 200 is likely to become faulty before long. Accordingly, the user can take measures, such as replacing the MCU 200 with a new one, before the MCU 200 becomes faulty.

Moreover, the MCU 200 pertaining to the second embodiment performs a lifetime prediction, using a security enhancing technique called PUF processing. Therefore, for the MCU 200 in which this PUF technique was adopted, it is possible to perform a lifetime prediction without using a method specialized for lifetime prediction. Also, the MCU 200 pertaining to the second embodiment performs a lifetime prediction by using an error ratio acquired by PUF processing. Therefore, there is no need for equipping the MCU 200 with an additional circuit that exclusively performs a lifetime prediction. Consequently, in the second embodiment, it is enabled to perform a lifetime prediction, while suppressing an increase in the circuit size.

Third Embodiment

Then, a third embodiment is described.

Figure 11:
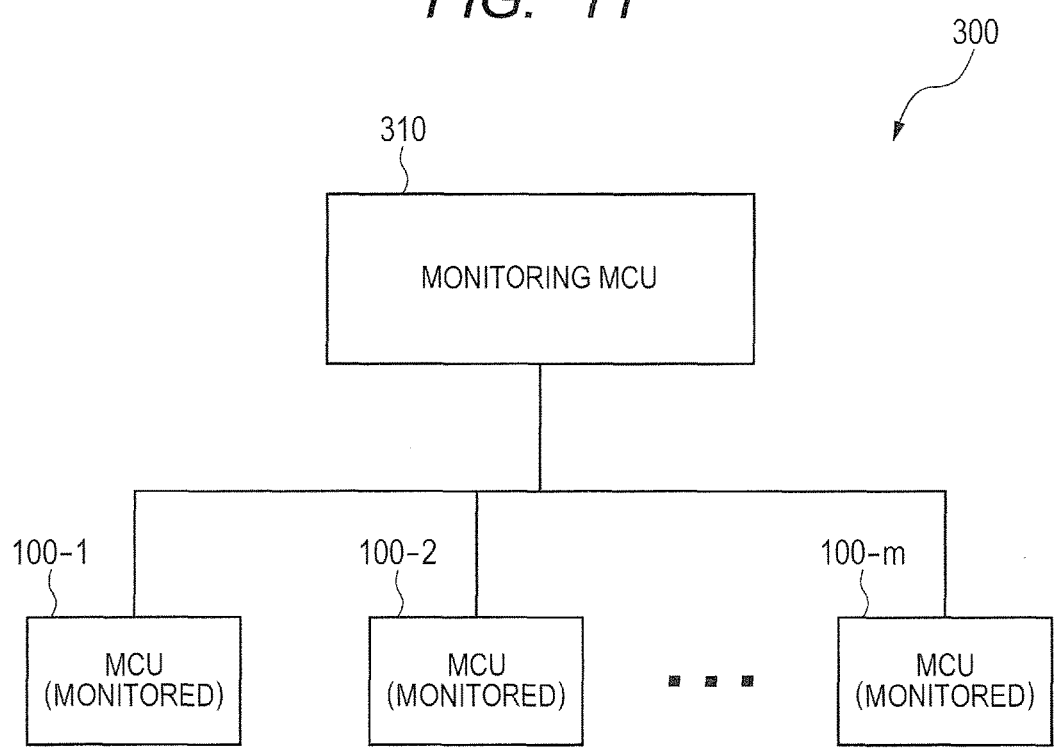
FIG. 11 is a diagram depicting a configuration of a lifetime prediction system pertaining to a third embodiment.

FIG. 11 is a diagram depicting a configuration of a lifetime prediction system 300 pertaining to the third embodiment. The lifetime prediction system 300 includes one or more MCUs 100-1 to 100-$m$ (where m is an integer larger than 1) and a monitoring MCU 310 which is a monitoring device. Here, as monitored MCUs, MCUs 100 pertaining to the first embodiment are depicted in FIG. 11; however, MCUs 200 pertaining to the second embodiment may be monitored. In the following, descriptions are provided about an example in which monitored MCUs are MCUs 100 pertaining to the first embodiment.

The monitoring MCU 310 includes, at least, a CPU 102, a RAM 104, a ROM 106, and an I/O 108. The I/O 108 of the monitoring MCU 310 functions as a communication circuit that receives data from each MCU 100 and sends data to each MCU 100. Likewise, the I/O 108 of each MCU 100 functions as a communication circuit that sends data to the monitoring MCU 310 and receives data from the monitoring MCU 310

The monitoring MCU 310 monitors the MCUs 100-1 to 100-*m*. The monitoring MCU 310 monitors, particularly, the lifetime of each of the MCUs 100-1 to 100-*m*. The monitoring MCU 310 determines whether or not each of the MCUs 100-1 to 100-*m* is close to its lifetime and, if a MCU 100 is close to its lifetime, performs error handling for the MCU 100.

Figure 12:
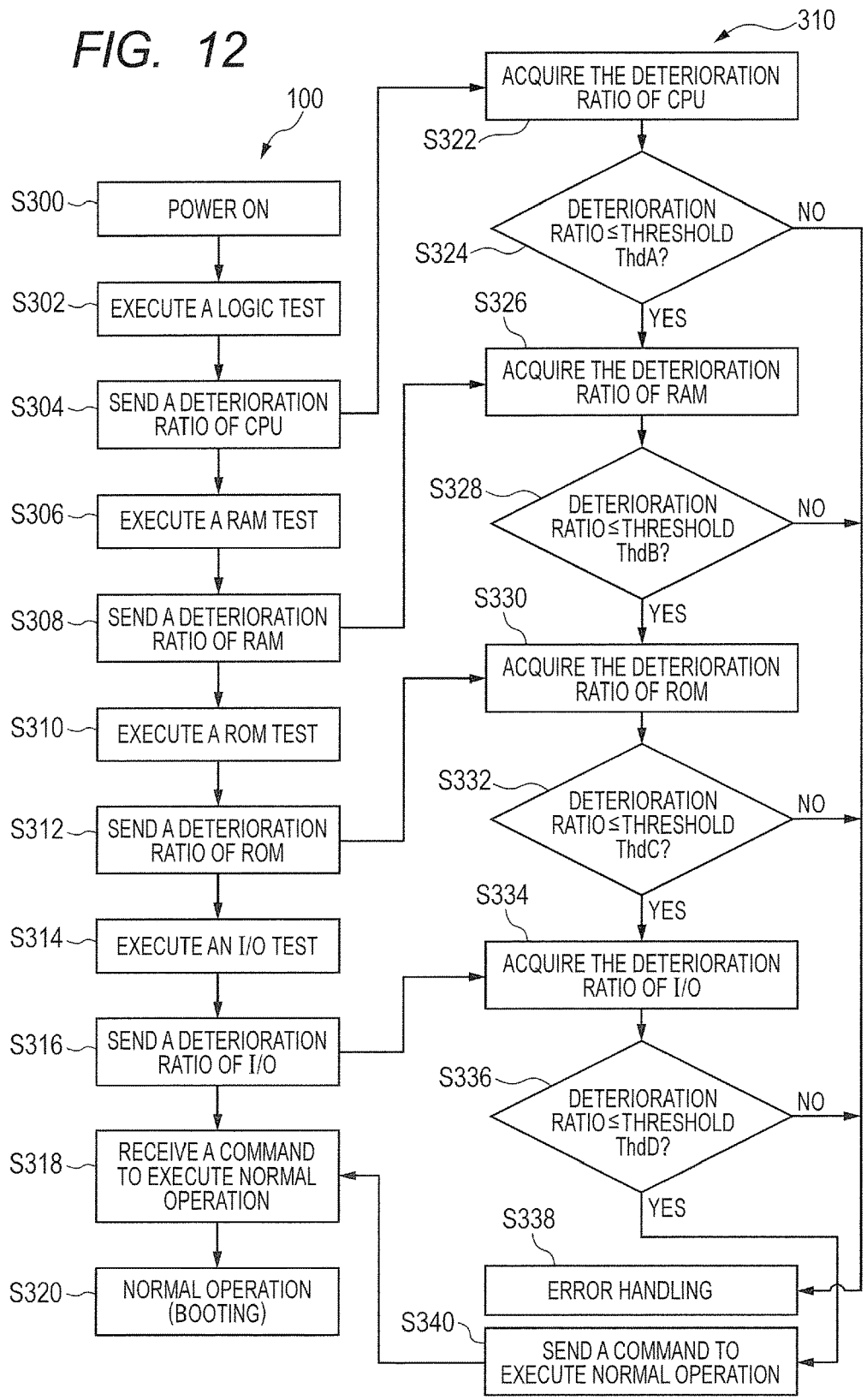
FIG. 12 is a flowchart illustrating a lifetime prediction method pertaining to the third embodiment.

FIG. 12 is a flowchart illustrating a lifetime prediction method pertaining to the third embodiment. In FIG. 12, processing steps S300 to S320 are executed by each MCU 100 and processing steps S322 to S340 are executed by the monitoring MCU 310. In the flowchart of FIG. 12, processing with respect to one MCU 100 is only illustrated. Meanwhile, in an instance where the monitoring MCU 310 performs a lifetime prediction with respect to multiple MCUs 100, the monitoring MCU 310 may perform a lifetime prediction of each MCU in order from an MCU 100-1 or may perform a lifetime prediction of multiple MCUs 100 concurrently.

First, an MCU 100 is powered on (step S300). Then, the sub-CPU 112 of the MCU 100 executes a logic test of the CPU 102, as done in step S102, and acquires a deterioration ratio of the CPU 102 (step S302). The I/O 108 of the MCU 100 sends data representing the deterioration ratio of the CPU 102 to the monitoring MCU 310 (step S304). The CPU 102 of the MCU 100 executes a RAM test of the RAM 104, as done in step S106, and acquires a deterioration ratio of the RAM 104 (step S306). The I/O 108 of the MCU 100 sends data representing the deterioration ratio of the RAM 104 to the monitoring MCU 310 (step S308).

The CPU 102 of the MCU 100 executes a ROM test of the ROM 106, as done in step S110, and acquires a deterioration ratio of the ROM 106 (step S310). The I/O 108 of the MCU 100 sends data representing the deterioration ratio of the ROM 106 to the monitoring MCU 310 (step S312). The CPU 102 of the MCU 100 executes an I/O test of the I/O 108, as done in step S114, and acquires a deterioration ratio of the I/O (step S314). The I/O 108 of the MCU 100 sends data representing the deterioration ratio of the I/O 108 to the monitoring MCU 310 (step S314).

The I/O 108 of the monitoring MCU 310 receives the data representing the deterioration ratio of the CPU 102 and, thereby, the monitoring MCU 310 acquires the deterioration ratio of the CPU 102 (step S322). The CPU 102 of the monitoring MCU 310 determines whether or not the deterioration ratio of the CPU 102 of the MCU 100 is below or at a threshold ThdA, as done in step S104 (step S324). If the deterioration ratio of the CPU 102 is not below or at the threshold ThdA, that is, if the deterioration ratio is more than the threshold ThdA (NO, as determined at S324), the CPU 102 of the monitoring MCU 310 determines that deterioration of the CPU 102 progresses to an extent that the MCU 100 is close to its lifetime. Then, the CPU 102 of the monitoring MCU 310 performs error handling predefined for the MCU 100 (step S338).

Likewise, the monitoring MCU 310 acquires the deterioration ratio of the RAM 104 (step S326). The monitoring MCU 310 determines whether or not the deterioration ratio of the RAM 104 is below or at a threshold ThdB, as done in step S108 (step S328). If the deterioration ratio of the RAM 104 is not below or at the threshold ThdB (NO, as determined at S328), the monitoring MCU 310 performs error handling predefined for the MCU 100 (step S338).

Likewise, the monitoring MCU 310 acquires the deterioration ratio of the ROM 106 (step S330). The monitoring MCU 310 determines whether or not the deterioration ratio of the ROM 106 is below or at a threshold ThdC, as done in step S112 (step S332). If the deterioration ratio of the ROM 106 is not below or at the threshold ThdC (NO, as determined at S332), the monitoring MCU 310 performs error handling predefined for the MCU 100 (step S338).

Likewise, the monitoring MCU 310 acquires the deterioration ratio of the I/O 108 (step S334). The monitoring MCU 310 determines whether or not the deterioration ratio of the I/O 108 is below or at a threshold ThdD, as done in step S116 (step S336). If the deterioration ratio of the I/O 108 is not below or at the threshold ThdD (NO, as determined at S336), the monitoring MCU 310 performs error handling predefined for the MCU 100 (step S338).

Meanwhile, if, for all the functional units, their deterioration ratio is below or at a threshold Thd, the monitoring MCU 310 sends a command to execute a normal operation to the MCU 100 (step S340). In particular, the CPU 102 of the monitoring MCU 310 generates a command to execute a normal operation and the I/O 108 of the monitoring MCU 310 sends the command to execute a normal operation to the MCU 100. When the I/O 108 of the MCU 100 receives the command to execute a normal operation (step S318), the MCU 100 executes a normal operation such as booting (step S320).

The monitoring MCU 310 pertaining to the third embodiment acquires a deterioration ratio (deterioration degree) of each of the functional units of each MCU 100 and, if the deterioration ratio of each is more than a predetermined threshold Thd, the monitoring MCU 310 executes processing to make a notification that the MCU 100 is close to its lifetime. Therefore, before an MCU 100 becomes faulty (i.e., as its lifetime has been reached), it is enabled to notify a user that the MCU 100 is likely to become faulty before long. Accordingly, the user can take measures, such as replacing the MCU 100 with a new one, before the MCU 100 becomes faulty.

Moreover, in the third embodiment, a configuration is made such that the monitoring MCU 310, not an MCU 100, performs a lifetime prediction. In other words, it is unnecessary for each MCU 100 to perform a lifetime prediction. Therefore, in the third embodiment, it is enabled to reduce the processing load of an MCU 100.

And now, each MCU 100 may perform a lifetime prediction and the monitoring MCU 310 may acquire only a result of lifetime prediction (indicating whether or not the MCU 100 is close to its lifetime) from each MCU 100. In this case, the monitoring MCU 310 may only perform error handling.

The foregoing processing is performed in the same way, even when MCUs 200 pertaining to the second embodiment are monitored. In this case, the PUF processing circuit 220 of each MCU 200 executes PUF processing for each of the functional units and acquires an error ratio of each functional unit. Then, the I/O 108 which is a communication circuit sends the error ratio to the monitoring MCU 310. The monitoring MCU 310 performs a lifetime prediction of each MCU 200, using the error rates received from each MCU 200.

In the above-described context, an MCU 100 sends a deterioration ratio (deterioration degree) of each of its functional units; however, no limitation to this is intended. The MCU 100 may execute only some processing steps halfway in the flowchart illustrated in FIG. 7. For instance, the MCU 100 executes processing up to a point of acquiring a fault degree of a semiconductor element of each functional unit, i.e., up to the processing step of S134 in FIG. 7. Here, this fault degree is a parameter for acquiring a deterioration ratio (deterioration degree). Then, the I/O 108 which is a communication circuit sends the fault degree to the monitoring MCU 310. Then, the monitoring MCU 310 which includes a circuit having the function of the sub-CPU 112 may execute the step 136 and subsequent steps in FIG. 7. For example, the CPU 102 of each MCU 100 functions as a lifetime prediction circuit that acquires a deterioration ratio (deterioration degree) of a fault degree which is a parameter that is used for acquiring a deterioration ratio.

The above is also true for MCUs 200 pertaining to the second embodiment. The PUF processing circuit 220 of an MCU 200 executes processing up to a point of acquiring an initial value (PUF value) which is response data from each of the functional units, i.e., up to the processing step S232 in FIG. 10. Then, the I/O 108 which is a communication circuit sends the initial value to the monitoring MCU 310. Then, the monitoring MCU 310 which may include an error correction unit 224 may execute the step S234 and subsequent steps in FIG. 10. That is, the PUF processing circuit 220 of each MCU 200 functions as a lifetime prediction circuit that acquires an error ratio (deterioration degree) or an initial value which is a parameter that is used for acquiring an error ratio.

Figure 13:
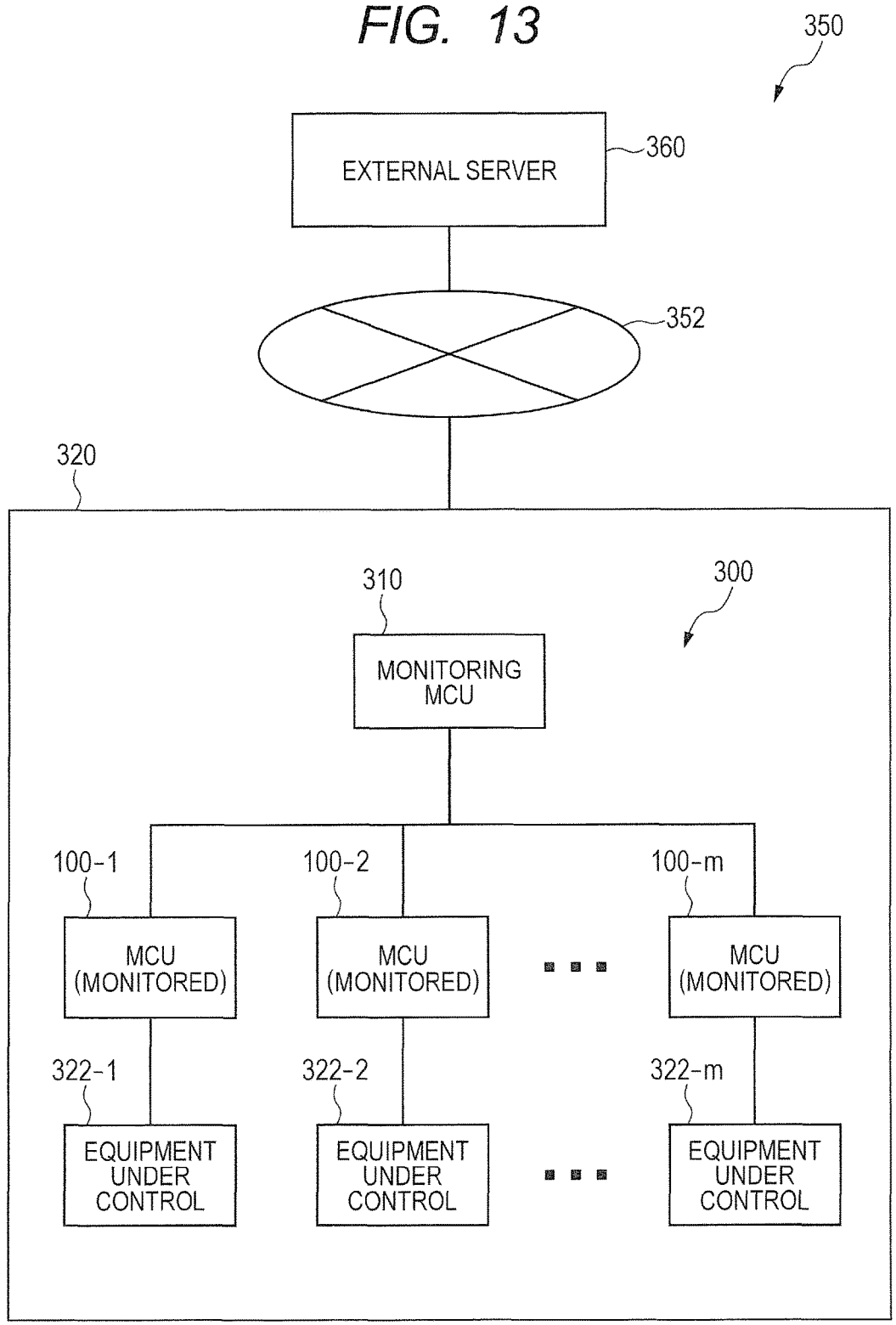
FIG. 13 is a diagram depicting a monitoring system pertaining to the third embodiment.

FIG. 13 is a diagram depicting a monitoring system 350 pertaining to the third embodiment. The monitoring system 350 includes a vehicle 320 and an external server 360. The external server 360 is computer and includes, at least, a CPU 102, a RAM 104, a ROM 106, an I/O 108, and a communication device capable of wireless communication.

The vehicle 320 is coupled to and enabled to communicate with the external server 360 via a network 352. The vehicle 320 includes a lifetime prediction system 300 depicted in FIG. 11 and equipments under control 322-1 to **322-*m*. The equipments under control 322-1 to 322-*m* are controllable equipments including, e.g., a prime mover, among others. The equipments under control 322-1 to 322-*m* are controlled by the MCUs 100-1 to 100-*m*, respectively. The I/O 108 of the monitoring MCU 310 transmits lifetime prediction results of all the MCUs 100 to the external server 360 via the network 352**.

Figure 14:
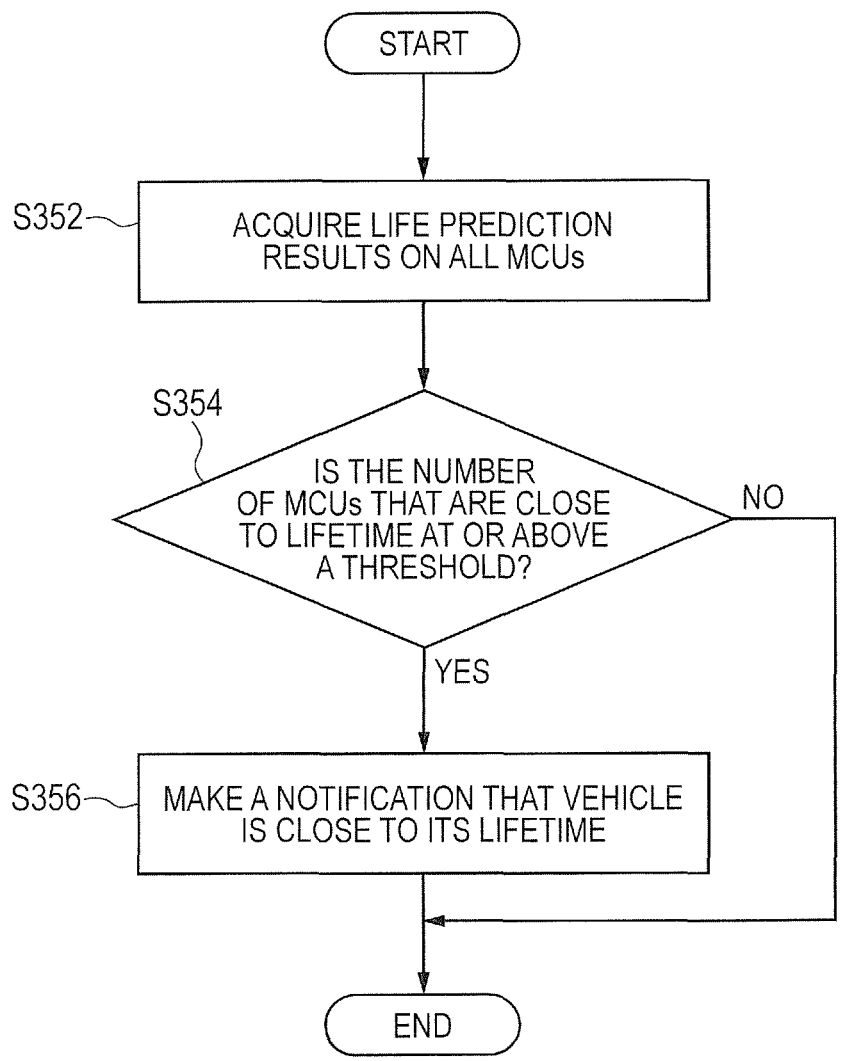
FIG. 14 is flowchart illustrating a lifetime prediction method for a vehicle, which is performed by an external server pertaining to the third embodiment.

FIG. 14 is flowchart illustrating a lifetime prediction method for the vehicle 320, which is performed by the external server 360 pertaining to the third embodiment. And now, the lifetime prediction method for the vehicle 320 in FIG. 14 is one example and the lifetime of the vehicle 320 may be evaluated by another method.

The external server 360 acquires lifetime prediction results of all the MCUs 100 from the monitoring MCU 310 (step S352). The external server 360 determines whether or not the number of MCUs 100 that are close to their lifetime is above or at a predetermined threshold (step S354). If the number of MCUs 100 that are close to their lifetime is above or at the threshold (YES, as determined at S354), the external server 360 makes a notification that the vehicle 320 is close to its lifetime (step S356). Thus, the external server 360 pertaining to the third embodiment is enabled to perform a lifetime prediction of the vehicle 320 coupled to and enabled to communicate with it.

In the above-described context, the external server 360 acquires lifetime prediction results of the MCUs 100 from the monitoring MCU 310; however, no limitation to this is intended. The external server 360 may perform a lifetime prediction of each MCU 100. In this case, the external server 360 may acquire a parameter that is used for acquiring a deterioration degree from the monitoring MCU 310. That is, the external server 360 may execute the processing steps S322 to S340 illustrated in FIG. 12. Thereby, it is possible to reduce the load of the monitoring MCU 310.

MODIFICATION EXAMPLES

Embodiments of the present invention are not limited to those configured as described hereinbefore. For example, an embodiment of the present invention, modified like an example of modification described below, can also be applicable.

First Modification Example

In the foregoing embodiments, a normal operation is executed after a lifetime prediction has been performed. Meanwhile, it is also possible to perform a lifetime prediction of an MCU during a normal operation, if it is desired to shorten the time it takes from power-on to startup. Details will be described below. And now, the following description concerns an example of modification to the first embodiment; however, the same also applies to the second embodiment.

Figure 15:
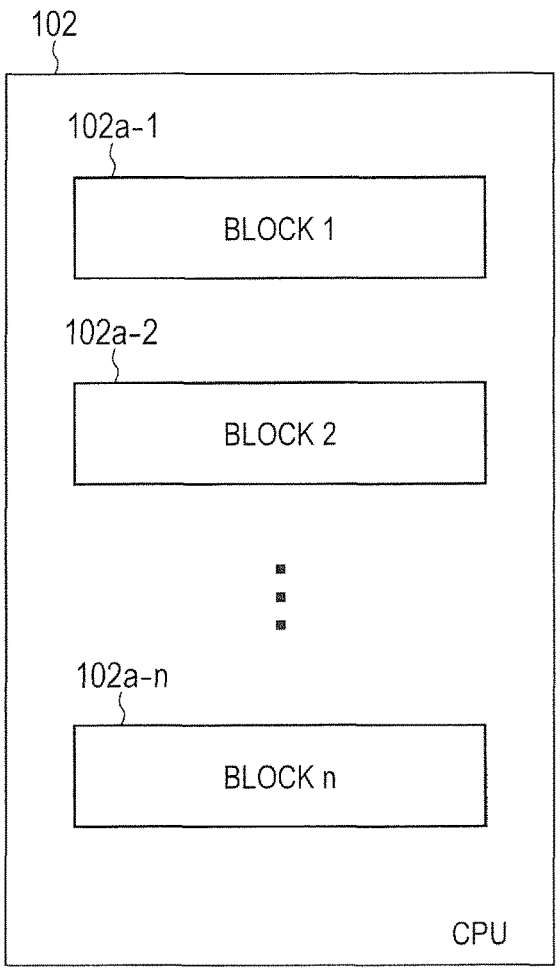
FIG. 15 is a diagram depicting a configuration of a CPU pertaining to a first modification example.

FIG. 15 is a diagram depicting a configuration of a CPU 102 pertaining to a first modification example. The CPU 102 is comprised of multiple blocks **102*a*-1 to 102*a*-*n* (where n is an integer larger than 2). For each of the blocks 102*a*-1 to 102*a*-*n*, a deterioration degree (deterioration ratio) can be acquired, respectively. And now, other functional units can also be comprised of multiple blocks similarly. The RAM 104 and ROM 106** may be comprised of logically separate blocks instead of physically separate blocks.

Figure 16:
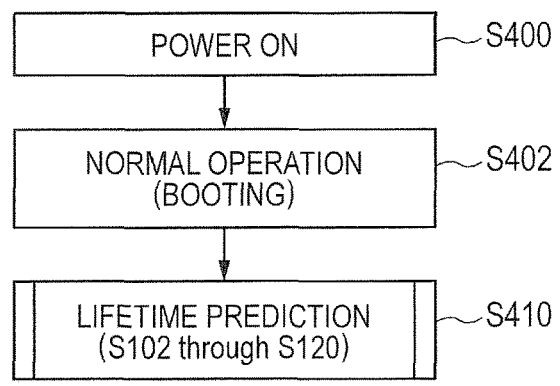
FIG. 16 is a flowchart illustrating a lifetime prediction method for an MCU pertaining to the first modification example.

FIG. 16 is a flowchart illustrating a lifetime prediction method for an MCU 100 pertaining to the first modification example. First, the MCU 100 is powered on (step S400). Then, the MCU 100 executes a normal operation such as booting (step S402). At this time, the CPU 102 executes a normal operation using a subset of the blocks **102*a*-1 to 102*a*-*n*. That is, all the blocks 102*a*-1 to 102*a*-*n* are not engaged in the operation concurrently and at least one block 102*a*** can be deactivated at a point of time during the normal operation.

The MCU 100 executes the processing steps S102 to S120 described previously, that is, it performs a lifetime prediction (S410). At this time, if the CPU 102 is a processing object (S102 to S104), the processing steps S102 to S104 can be executed for a block **102*a* deactivated during the normal operation. If processing is to be executed for other functional units (S106 to S120), the block 102*a* deactivated during the normal operation can execute the processing steps S106 to S120**. In this way, it is possible to perform a lifetime prediction of an MCU during a normal operation, if it is desired to shorten the time it takes from power-on to startup.

Second Modification Example

In the foregoing embodiments, a semiconductor device has a hardware configuration depicted in FIG. 3 or FIG. 8; however, the hardware configuration is not limited to that depicted in FIG. 3 or FIG. 8. Another hardware configuration is described below. And now, the following description concerns an example of modification to the hardware configuration pertaining to the first embodiment; however, the same also applies to the second embodiment.

Figure 17:
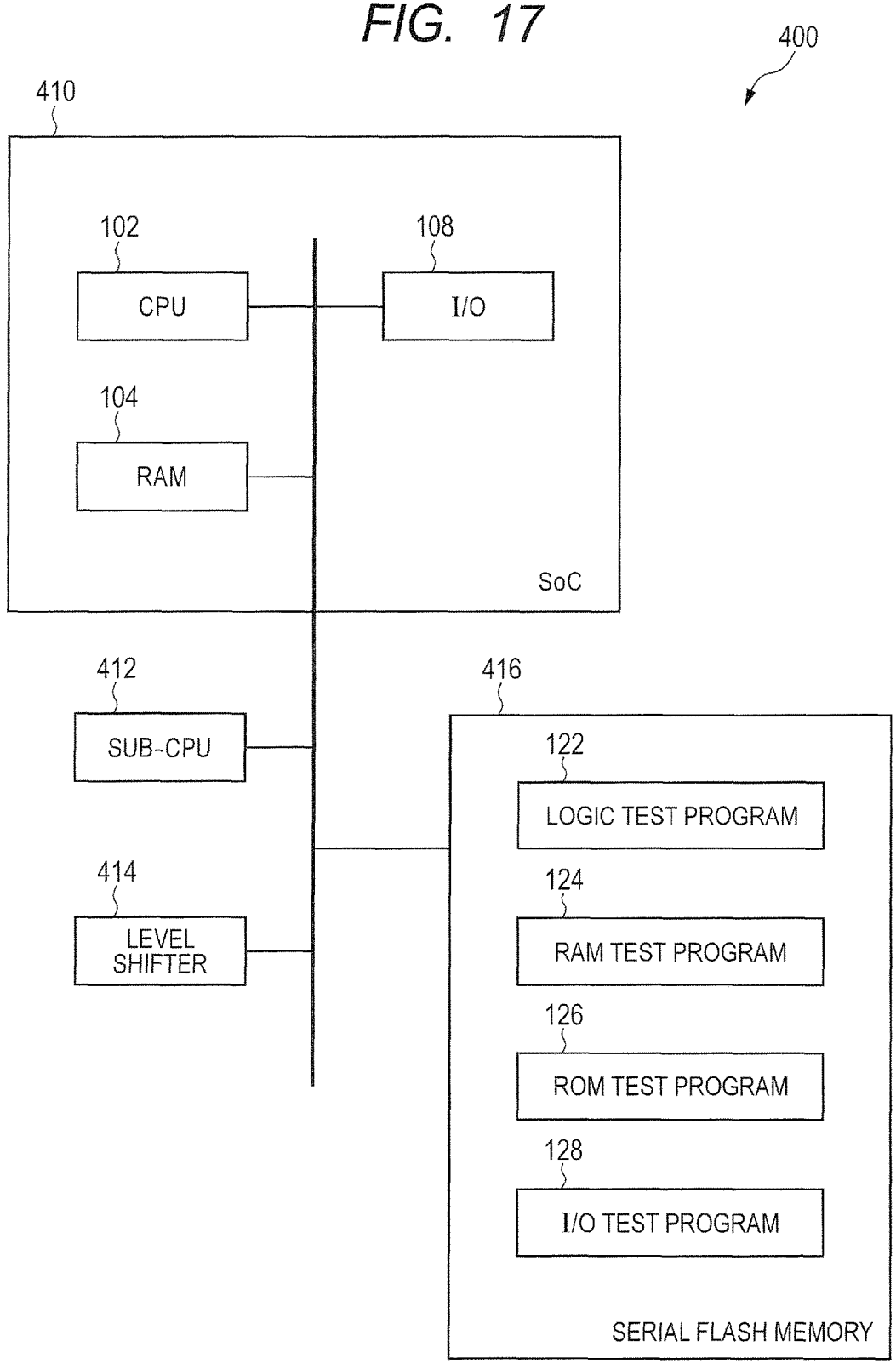
FIG. 17 is a diagram depicting a semiconductor system pertaining to a second modification example.

FIG. 17 is a diagram depicting a semiconductor system 400 pertaining to a second modification example. FIG. 17 presents an example in which a SoC (System on Chip) is a semiconductor device for which a lifetime prediction should be performed. The semiconductor system 400 includes a SoC 410, a sub-CPU 412, a level shifter 414, and a serial flash memory 416. These components are coupled to one another via a bus.

The SoC 410 includes a CPU 102, a RAM 104, and an I/O 108. The SoC 410 may include a ROM 106. The sub-CPU 412 has substantially the same function as the sub-CPU 112. Also, the level shifter 414 has substantially the same function as the level shifter 114. The serial flash memory 416 stores a logic test program 122, a RAM test program 124, a ROM test program 126, and an I.O test program 128. In the hardware configuration as above, it is possible to perform a lifetime prediction of the SoC through a method pertaining to any of the foregoing embodiments.

Figure 18:
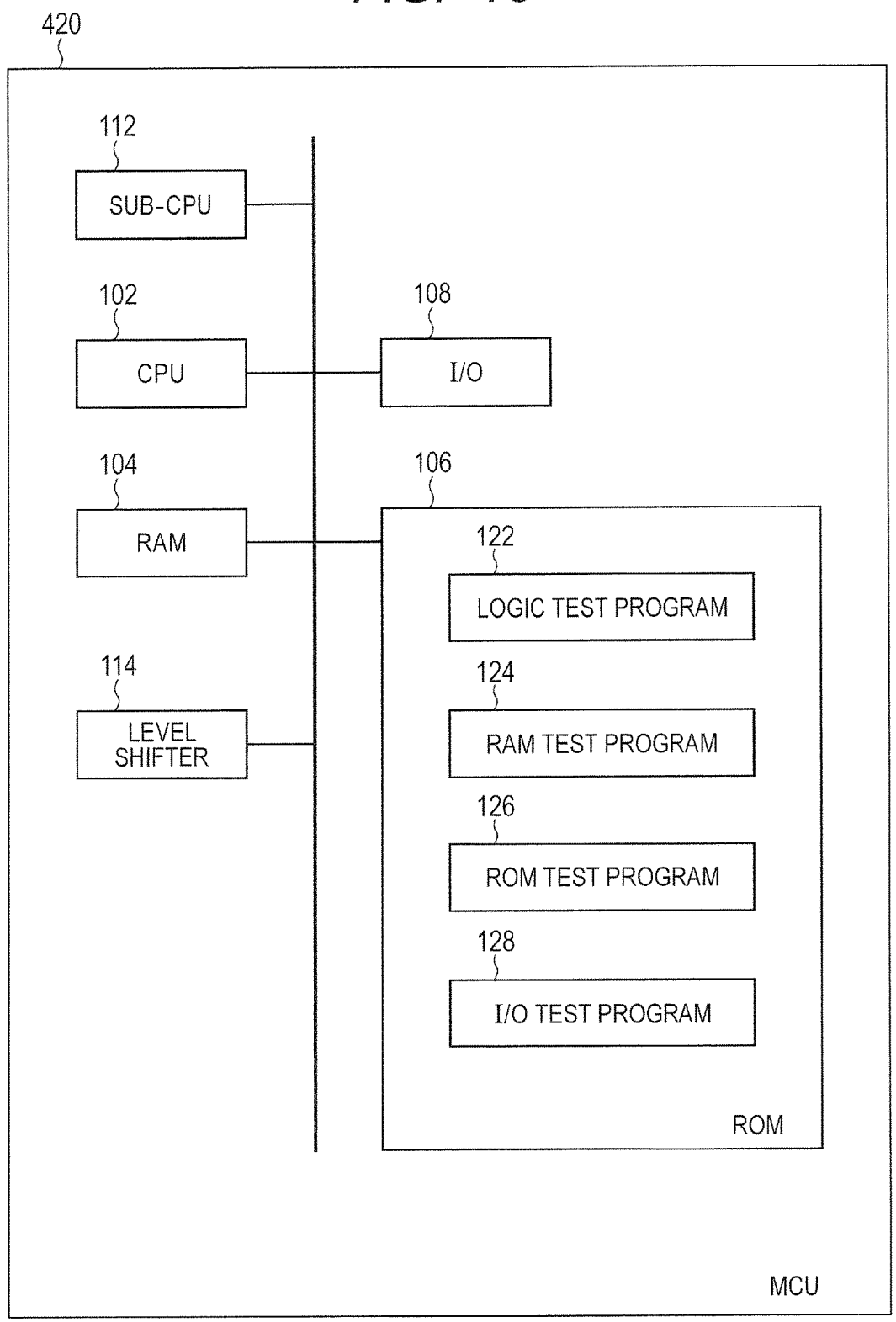
FIG. 18 is a diagram depicting an MCU pertaining to the second modification example.

FIG. 18 is a diagram depicting an MCU 420 pertaining to the second modification example. The MCU 420 includes a CPU 102, a RAM 104, a ROM 106, an I/O 108, a sub-CPU 112, and a level shifter 114. In an example of FIG. 18, instead of a mask ROM 120, the ROM 106 stores a logic test program 122, a RAM test program 124, a ROM test program 126, and an I/O test program 128. In the configuration as above, it is possible to perform a lifetime prediction of the MCU without a mask ROM through a method pertaining to any of the foregoing embodiments.

Figure 19:
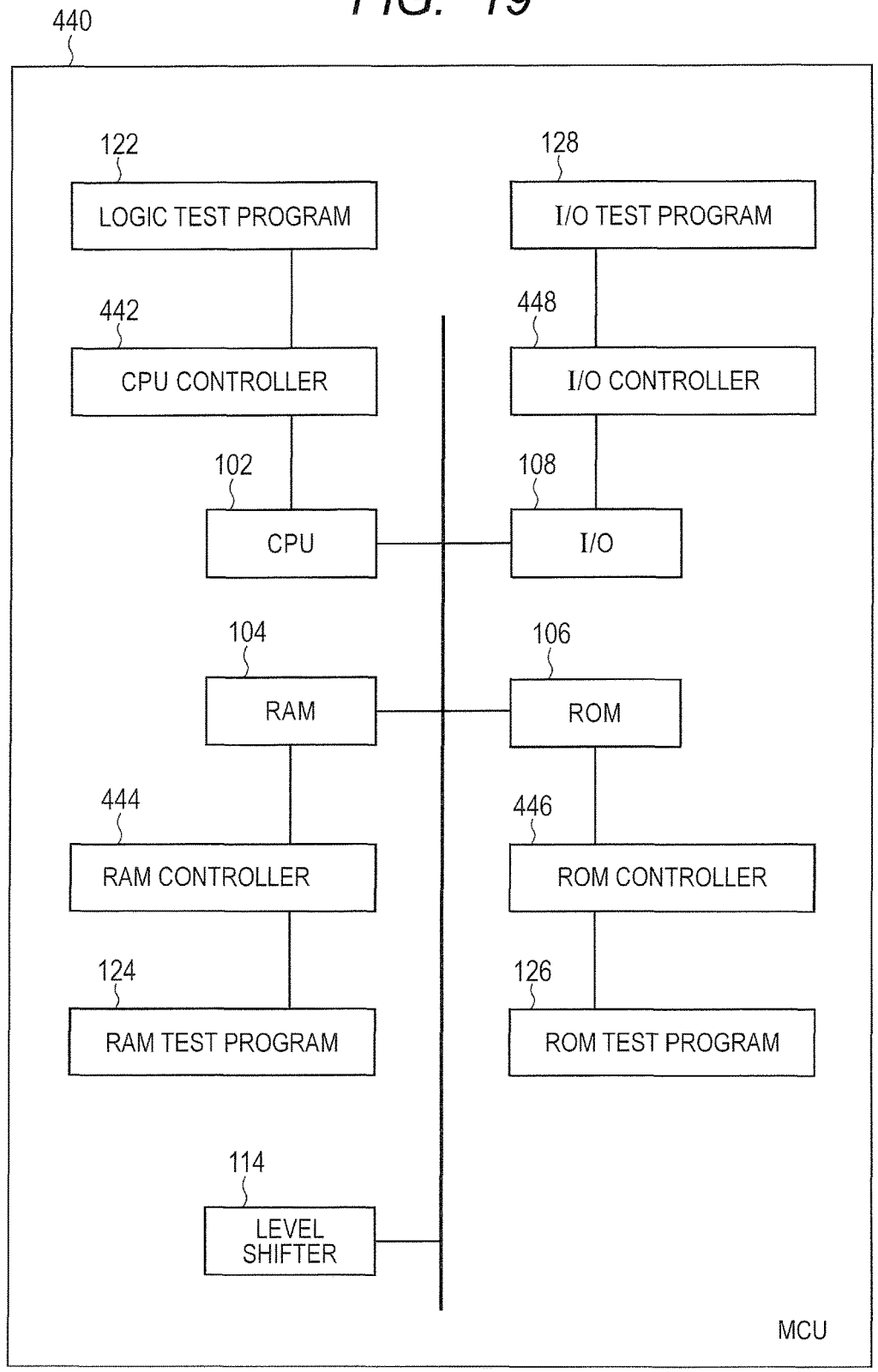
FIG. 19 is a diagram depicting an MCU pertaining to the second modification example.

FIG. 19 is a diagram depicting an MCU 440 pertaining to the second modification example. The MCU 440 includes a CPU 102, a RAM 104, a ROM 106, an I/O 108, and a level shifter 114. The MCU 440 further includes a CPU controller 442, a RAM controller 444, a ROM controller 446, and an I/O controller 448. The MCU 440 also includes a logic test program 122, a RAM test program 124, a ROM test program 126, and an I/O test program 128 which are located separately from one another.

The CPU controller 442, RAM controller 444, ROM controller 446, and I/O controller 448 each correspond to the foregoing lifetime prediction circuit 4. The CPU controller 442, RAM controller 444, ROM controller 446, and I/O controller 448 are coupled to the CPU 102, RAM 104, ROM 106, and I/O 108, respectively. The CPU controller 442, RAM: controller 444, ROM controller 446, and I/O controller 448 control the CPU 102, RAM 104, ROM 106, and I/O 108, respectively.

In particular, the CPU controller 442 executes the logic test program 122 and performs a lifetime prediction of the CPU 102. Likewise, the RAM controller 444 executes the RAM test program 124 and performs a lifetime prediction of the RAM 104. The ROM controller 446 executes the ROM test program 126 and performs a lifetime prediction of the ROM 106. The I/O controller 448 executes the I/O test program 128 and performs a lifetime prediction of the I/O 108. As just described, an independent hardware configuration may be provided for each functional unit to execute a test program for the functional unit.

Other Modification Examples

In the foregoing embodiments, an example where a product in which a semiconductor device (such as an MCU) pertaining to any of the foregoing embodiments is assembled is a vehicle was set forth; however, such product may be other than a vehicle. For example, a product in which such semiconductor device (such as an MCU) is assembled may be a signal control system for a railroad or the like or a home electric appliance or the like, such as a refrigerator. An embodiment of the present invention is also beneficial for an overall system where multiple equipments are coupled over a network, such as a Smart Home and a Smart Building.

Moreover, in the foregoing embodiments, it was stated that, for each of the functional units, its deterioration degree is acquired in order; however, no limitation to this is intended. For plural functional units, their deterioration degrees may be acquired concurrently. Moreover, for all the functional units, their deterioration degrees may be acquired concurrently, if permitted by the hardware configuration. Besides, if there is a functional unit having a high sensitivity to deterioration, that is, a functional unit whose deterioration, if detected, (without regard to other functional units), allows to diagnose that a semiconductor device including it is close to its lifetime, once the deterioration degree of the functional unit has been compared with a threshold, further processing for other functional units may be dispensed with. If, for example, the RAM 104 has a high sensitivity to deterioration, the step S110 and subsequent processing steps in FIG. 5 and the step S210 and subsequent steps in FIG. 9 may be dispensed with. The above is also true if a functional unit other than the RAM 104 has a high sensitivity to deterioration. And now, as described previously, a circuit that executes PUF processing is a device having a high sensitivity to deterioration among semiconductor circuits; therefore, it can be more effective to dispense with processing for functional units other than a functional unit having a high sensitivity to deterioration during PUF processing.

Besides, in the foregoing embodiments, it was stated that, for each of the functional units, when its deterioration degree has become more than a threshold, that is, the deterioration degree of at least one functional unit has become more than a threshold, error handing is performed; however, no limitation to this is intended. When the deterioration degrees of all the functional units have become more than a threshold, error handling may be performed. However, by making an arrangement so that error handling will be performed when the deterioration degree of at least one functional unit has become more than a threshold, a notification can be made upon detecting that one functional unit becomes faulty. Therefore, it is enabled to notify a user more reliably before the lifetime of a semiconductor device has been reached (before the semiconductor device become faulty). Consequently, the user can replace a semiconductor device more reliably before it becomes faulty.

Besides, in the foregoing embodiments, a configuration was made to carry out a test of each of the functional units, acquire a deterioration degree, and perform a lifetime prediction of a semiconductor device, before the semiconductor device (such as an MCU) executes a normal operation such as booting; no limitation to this configuration is intended. A lifetime prediction may be performed before a normal operation, as in the first modification example. However, in the first modification example, if the hardware of a semiconductor device has become faulty, a normal operation, even if executed, becomes ineffective, because of the hardware fault. On the other hand, when a normal operation is executed after a lifetime prediction, error handing is performed, if the hardware of a semiconductor device has become faulty. Therefore, it is enabled to prevent a normal operation from becoming ineffective.

Besides, in the foregoing embodiments, it was stated that, test programs such as a logic test program 122 are stored in a semiconductor device for which a lifetime prediction should be performed; however, no limitation to this is intended. Test programs may be provided from outside of a semiconductor device and the CPU 102 or the like may execute the test programs provided from outside.

Furthermore, in an instance where a light emitter is incorporated in a semiconductor device (such as an MCU), making the light emitter emit light is also included in error handling. Besides, different types of error handling may be applied to different semiconductor devices (such as MCUs). Different types of error handing may be applied according the importance of an equipment controlled by a semiconductor device. For example, in the case of a semiconductor device that controls the engine of a vehicle, warning or processing to stop the vehicle may be performed as error handling. In the case of a semiconductor device that controls a power window, processing to turn the light emitter on may only be performed.

While the invention made by the present inventors has been described specifically based on its embodiments hereinbefore, it goes without saying that the present invention is not limited to the described embodiments and various modifications may be made thereto without departing from the gist of the invention.

What is claimed is:

1. A semiconductor device comprising:
   one or more functional units; and
   a lifetime prediction circuit that acquires a deterioration degree indicating a degree of how each of the functional units deteriorates, using a signal that is output from each of the functional units, and, if the deterioration degree is more than a first threshold which has been predetermined, executes processing to make a notification that the semiconductor device is close to its lifetime,
   wherein the lifetime prediction circuit decreases a power supply voltage of the semiconductor device and executes a test of each of the functional units, thereby acquiring the deterioration degree.

2. The semiconductor device according to claim 1,
   wherein the semiconductor device comprises a plurality of functional units,
   wherein one of the functional units comprises a central processing circuit, and
   wherein the central processing circuit functions as the lifetime prediction circuit, when executing the tests of the functional units other than the central processing unit.

3. The semiconductor device according to claim 1, further comprising a mask read-only memory (ROM) that stores programs for the tests,
   wherein the lifetime prediction circuit carries out the tests by executing the programs stored in the mask ROM.

4. The semiconductor device according to claim 1,
   wherein the lifetime prediction circuit executes processing based on a physically unclonable function (PUF) for each of the functional units, thereby acquiring the deterioration degree.

5. The semiconductor device according to claim 4,
   wherein the lifetime prediction circuit outputs source data to each of the functional units and acquires an error ratio of response data responsively generated by each of the functional units as the deterioration degree.

6. The semiconductor device according to claim 1,
   wherein the semiconductor device comprises a plurality of functional units, and
   wherein the lifetime prediction circuit executes processing to make the notification, if the deterioration degree of at least one of the functional units is more than the first threshold.

7. The semiconductor device according to claim 1,
   wherein the lifetime prediction circuit determines whether or not the deterioration degree is below or at the first threshold, before the semiconductor device executes a normal operation.

8. A lifetime prediction method comprising:
   acquiring a deterioration degree indicating a degree of how each functional unit deteriorates, using a signal that is output from one or more functional units comprised in a semiconductor device;
   determining whether or not the deterioration degree is below or at a first threshold which has been predetermined; and
   executing processing to make a notification that the semiconductor device is close to its lifetime, if the deterioration degree is more than the first threshold,
   wherein the deterioration degree is acquired by decreasing a power supply voltage of the semiconductor device and executing a test of each of the functional units.

9. The lifetime prediction method according to claim 8,
   wherein the deterioration degree is acquired by executing processing based on a physically unclonable function (PUF) for each of the functional units.

10. The lifetime prediction method according to claim 9,
    wherein source data is output to each of the functional units and an error ratio of response data responsively generated by each of the functional units is acquired as the deterioration degree.

11. The lifetime prediction method according to claim 8,
    wherein the semiconductor device comprises a plurality of functional units, and
    wherein the processing to make the notification is executed, if the deterioration degree of at least one of the functional units is more than the first threshold.

12. The lifetime prediction method according to claim 8,
    wherein a determination is made as to whether or not the deterioration degree is below or at the first threshold, before the semiconductor device executes a normal operation.

13. A semiconductor device comprising:
    one or more functional units; and
    a lifetime prediction circuit that acquires a deterioration degree indicating a degree of how each of the functional units deteriorates, using a signal that is output from each of the functional units, and, if the deterioration degree is more than a first threshold which has been predetermined, executes processing to make a notification that the semiconductor device is close to its lifetime,
    wherein the lifetime prediction circuit executes processing based on a physically unclonable function (PUF) for each of the functional units, thereby acquiring the deterioration degree, and
    wherein the lifetime prediction circuit outputs source data to each of the functional units and acquires an error ratio of response data responsively generated by each of the functional units as the deterioration degree.

14. The semiconductor device according to claim 13,
    wherein the lifetime prediction circuit decreases a power supply voltage of the semiconductor device and executes a test of each of the functional units, thereby acquiring the deterioration degree.

15. The semiconductor device according to claim 14,
    wherein the semiconductor device comprises a plurality of functional units,
    wherein one of the functional units is a central processing circuit, and wherein the central processing circuit functions as the lifetime prediction circuit, when executing the tests of the functional units other than the central processing unit.

16. The semiconductor device according to claim 15, further comprising a mask read-only memory (ROM) that stores programs for the tests,
wherein the lifetime prediction circuit carries out the tests by executing the programs stored in the mask ROM.

17. The semiconductor device according to claim 13, wherein the semiconductor device comprises a plurality of functional units, and
wherein the lifetime prediction circuit executes processing to make the notification, if the deterioration degree of at least one of the functional units is more than the first threshold.

18. The semiconductor device according to claim 13, wherein the lifetime prediction circuit determines whether or not the deterioration degree is below or at the first threshold, before the semiconductor device executes a normal operation.

* * * * *